(12) United States Patent
Ishikawa

(10) Patent No.: US 6,429,937 B2
(45) Date of Patent: Aug. 6, 2002

(54) PATTERN READING APPARATUS

(75) Inventor: Tuyoshi Ishikawa, Tokyo (JP)

(73) Assignee: Asahi Kogaku Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/820,822

(22) Filed: Mar. 30, 2001

Related U.S. Application Data

(62) Division of application No. 08/916,408, filed on Aug. 22, 1997, now Pat. No. 6,310,689.

(30) Foreign Application Priority Data

| Aug. 23, 1996 | (JP) | ............................................. 8-241112 |
| Oct. 25, 1996 | (JP) | ............................................. 8-301076 |
| Dec. 6, 1996 | (JP) | ............................................. 8-342775 |
| Dec. 6, 1996 | (JP) | ............................................. 8-342776 |
| Dec. 6, 1996 | (JP) | ............................................. 8-342777 |
| Dec. 6, 1996 | (JP) | ............................................. 8-342778 |
| Mar. 4, 1997 | (JP) | ............................................. 9-65333 |
| Mar. 4, 1997 | (JP) | ............................................. 9-65334 |
| Mar. 11, 1997 | (JP) | ............................................. 9-74497 |
| May 8, 1997 | (JP) | ............................................. 9-134312 |
| Jun. 6, 1997 | (JP) | ............................................. 9-165422 |

(51) Int. Cl.$^7$ ......................... G01N 21/55; G01N 21/47
(52) U.S. Cl. ...................................... 356/445; 356/446
(58) Field of Search ........................ 356/237.4, 237.5, 356/445–448, 371, 600

(56) References Cited

U.S. PATENT DOCUMENTS

| 3,790,287 A | 2/1974 | Cuthbert et al. |
| 4,314,763 A | 2/1982 | Steigmeier et al. |
| 4,416,538 A | 11/1983 | Mueller et al. |
| 4,795,911 A | 1/1989 | Kohno et al. |
| 4,865,455 A | 9/1989 | Kohno et al. |
| 4,968,876 A | 11/1990 | Lima |
| 5,497,234 A | 3/1996 | Haga |
| 5,504,317 A | 4/1996 | Takahashi |
| 5,583,632 A | 12/1996 | Haga |

FOREIGN PATENT DOCUMENTS

| EP | 0702206 | 3/1996 |
| JP | 6-3625 | 1/1994 |
| JP | 6-129844 | 5/1994 |
| JP | 7-83845 | 3/1995 |
| JP | 7-107346 | 4/1995 |
| JP | 7-325036 | 12/1995 |

*Primary Examiner*—Frank G. Font
*Assistant Examiner*—Amanda Merlino
(74) *Attorney, Agent, or Firm*—Greenblum & Bernstein, P.L.C.

(57) ABSTRACT

A pattern reading apparatus reads a pattern from a reflective object. The pattern reading apparatus includes a minute-area light source, an objective lens system, an imaging lens, and an imaging element. The objective lens system causes the illumination light beam from the light source to be incident on the object and converges the light beam reflected from the object. The imaging lens forms an image of the object using only a diffused component of light which has been reflected from the object. The imaging element is disposed at a position where the image of the pattern is imaged for reading the pattern. An adjustment mechanism adjusts a position of the light source in a plane perpendicular to a principal beam of the illumination light beam.

16 Claims, 31 Drawing Sheets

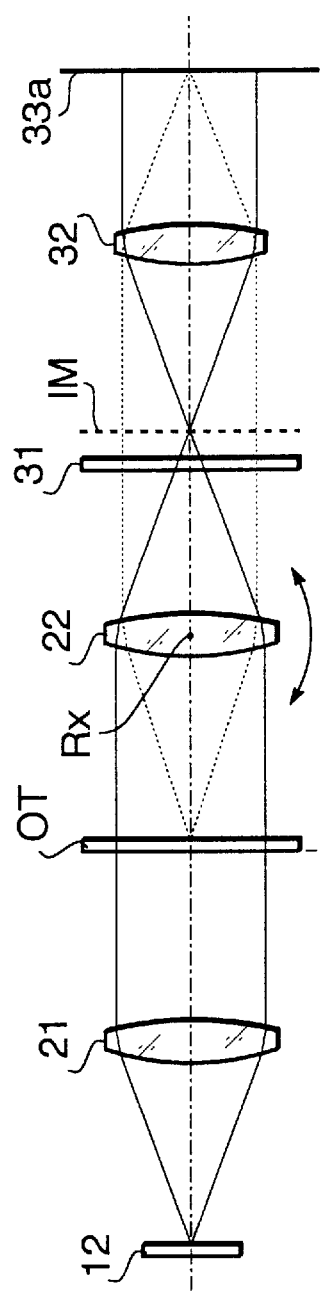
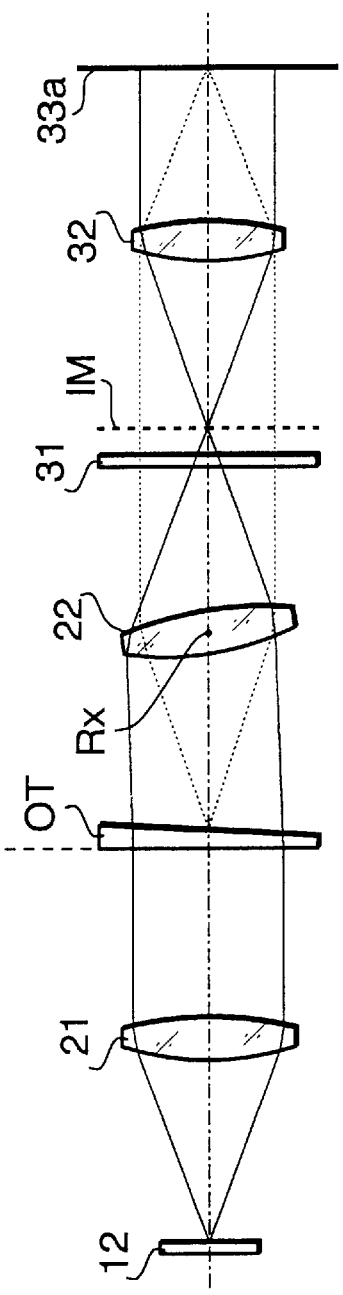
FIG. 12(A)
FIG. 12(B)

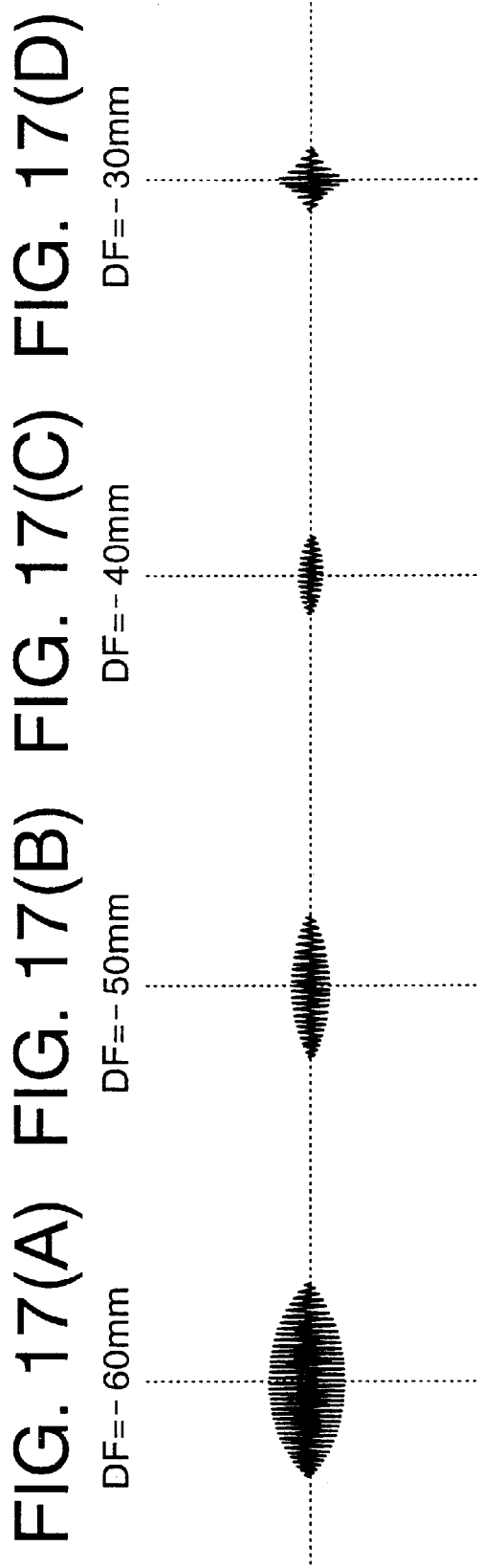
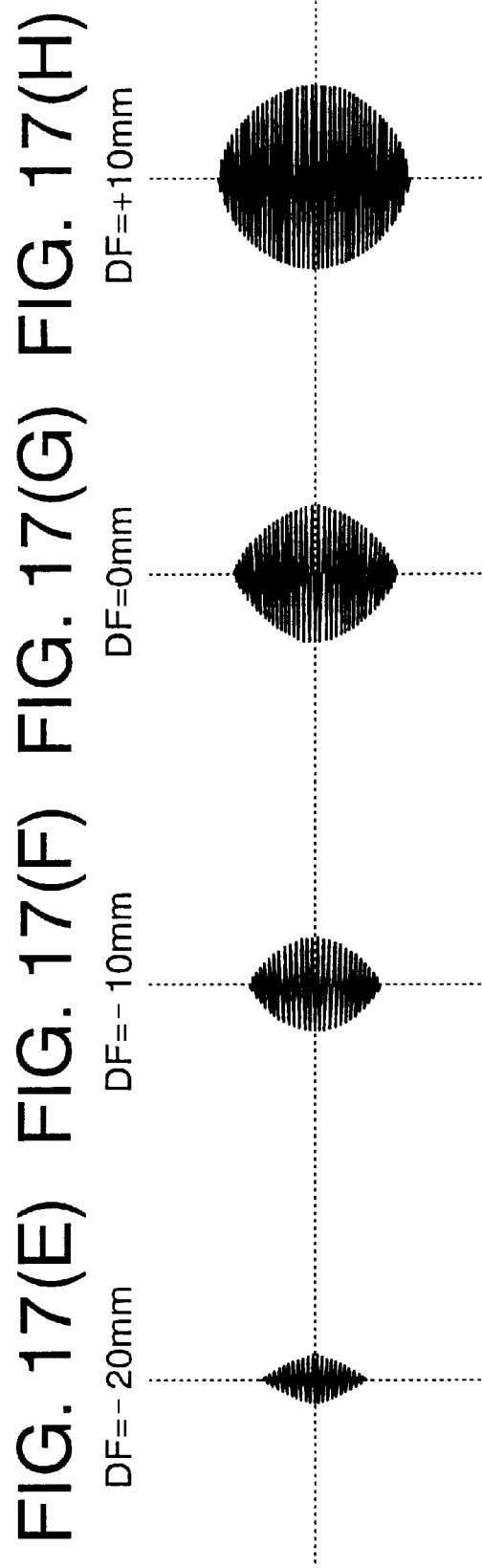
FIG. 17(A) DF=−60mm
FIG. 17(B) DF=−50mm
FIG. 17(C) DF=−40mm
FIG. 17(D) DF=−30mm
FIG. 17(E) DF=−20mm
FIG. 17(F) DF=−10mm
FIG. 17(G) DF=0mm
FIG. 17(H) DF=+10mm

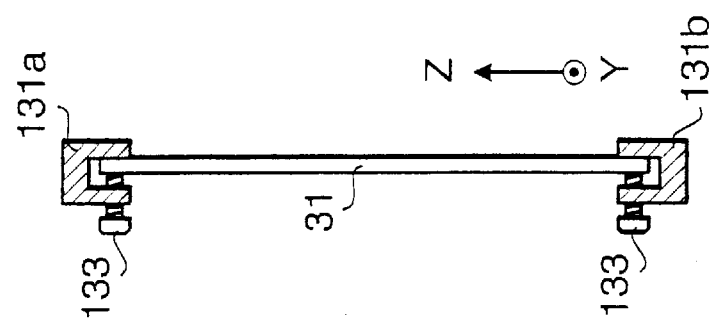
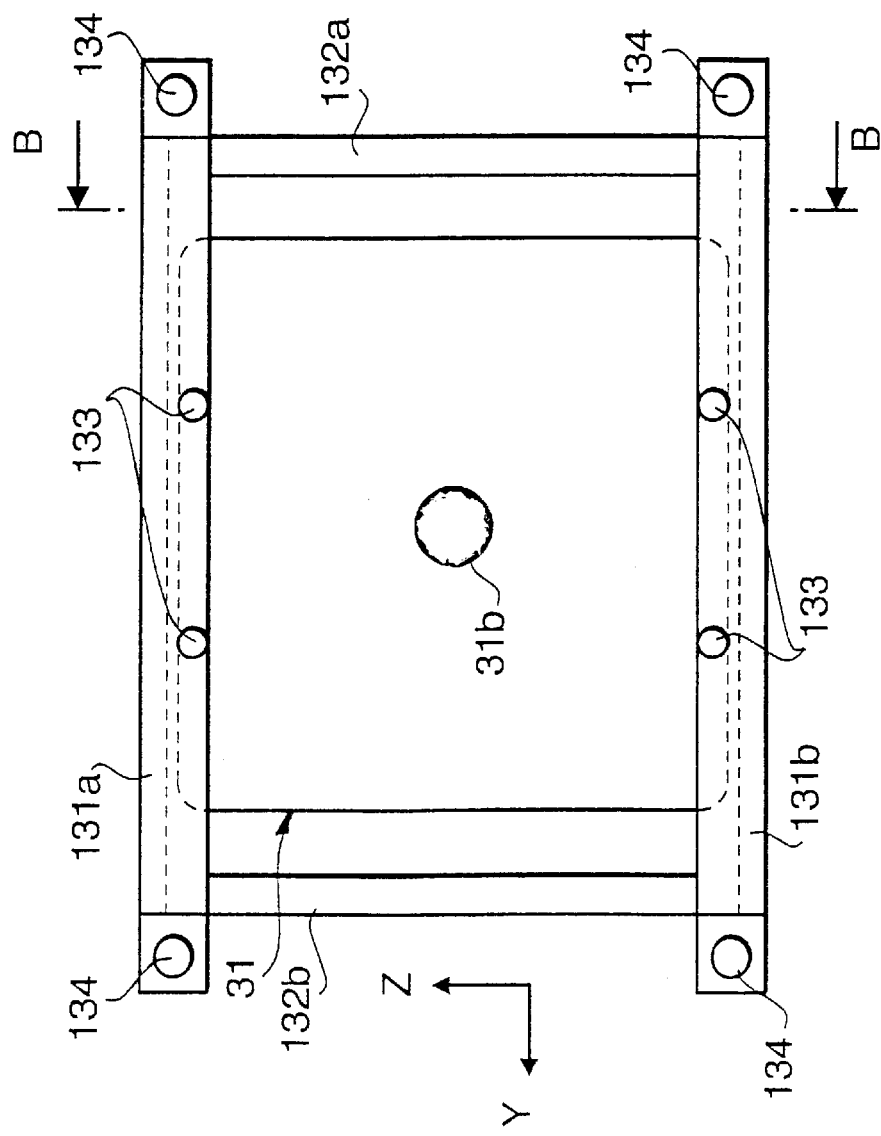

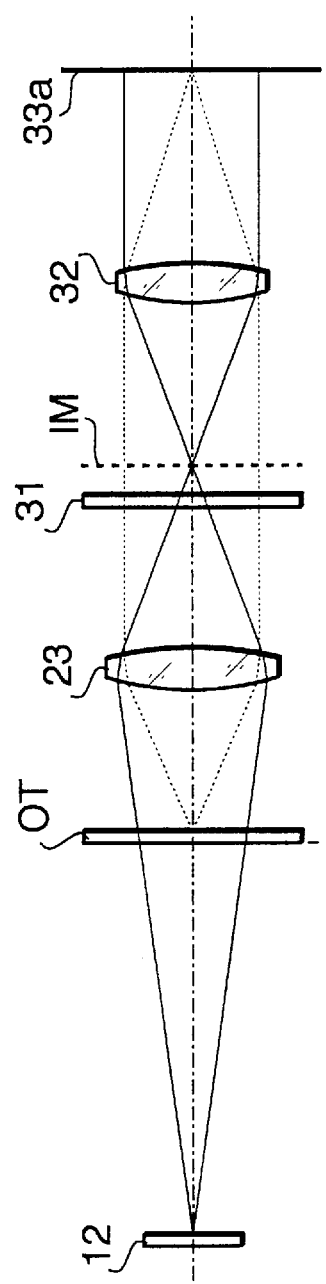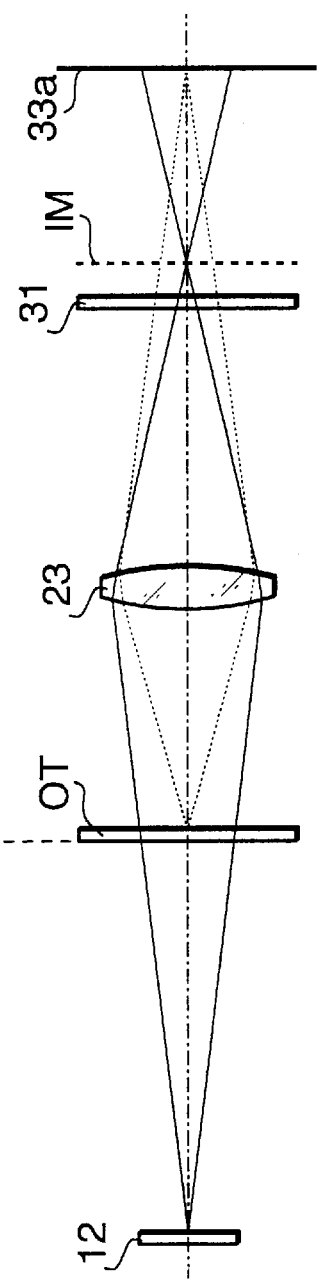
FIG. 30(A)
FIG. 30(B)

PATTERN READING APPARATUS

This is a division of U.S. patent application Ser. No. 08/916,408, filed Aug. 22, 1997, now U.S. Pat. No. 6,310,689, the contents of which are expressly incorporated by reference herein in its entirety.

BACKGROUND OF THE INVENTION

The present invention relates to a pattern reading apparatus for reading a pattern formed on a surface of a silicon wafer or the like, and more specifically, to a pattern reading apparatus for reading a pattern formed on a reflective or transparent surface.

In manufacturing semiconductor products, semiconductor layers are applied to a semiconductor substrate, such as a silicon wafer or the like, by vapor deposition and then design patterns are formed by photo-lithography processes, etching processes, and the like. In general, a serial number is applied to the silicon wafer by laser etching so that the silicon wafer can be tracked during the pattern forming processes based on the serial number. Conventionally, the serial number on the silicon wafer is discriminated by a worker visually examining the wafer.

However, since the silicon wafer is mirror finished, for a worker to read the serial number, the wafer must be viewed obliquely while holding it to the light, or by some similar method. Further, since the quality of the pattern may deteriorate as the silicon wafer is subjected to processes such as etching, vapor deposition and the like, it is particularly difficult to discriminate the serial number of the silicon wafer after a number of such processes.

Conventionally, two types of pattern reading devices have been known: a reflective-type reading device, and a transmission-type reading device. The former is used for reading a pattern formed on a reflective surface, and the latter is used for reading a pattern formed on a transmission-type surface.

In an example of the reflective-type reading device, light emitted by a light source is incident, through a lens, to a surface on which the pattern is formed, and an image of the pattern is formed by an imaging lens on a screen or the like. In this case, a portion of the light incident to the lens is reflected on a surface of the lens to create ghosting light, which reaches the screen and reduces contrast of the image of the pattern. Further, the specular reflection from the surface having the pattern formed thereon may be incident on the screen making it more difficult to observe the image of the pattern.

As an example of the transmission-type reading device, a known device has a Fourier transformation lens, that is used for reading a pattern formed on a light-transmission-type object by subjecting the pattern to a predetermined filter processing. In these optical systems, the light beam from a point light source passes through a first lens and is incident on an object as a parallel light beam. After passing through the object, the light beam is converged by a second lens and caused to pass through a spatial filter disposed at the back focal point of the second lens. When an imaging lens, having the front focal point set to the position of the filter, is disposed behind the filter, an object image, which is affected by the function of the filter, is formed at the back focal point of the imaging lens.

For example, to output an emphasized image of a pattern formed on an object surface, a high-pass filter may be used as the spatial filter to shade the paraxial rays which correspond to the image of the point light source. Further, an imaging element may be disposed at the imaging position to capture and process the image for further processing or displaying on a display unit.

In the above conventional filtering optical system, however, when an objective lens (first lens) has spherical aberration such as, for example, a spherical single lens or when coma and curvature of field arise because a light beam is obliquely incident on the objective lens, there is a problem in that the light beam which forms the image of a point light source does not converge to a point but scatters over a larger area such that a large shading region must be provided to properly execute filtering. Thus, a quantity of light used to form the image is lowered.

In a pattern reading apparatus using the above conventional filtering optical system, since the magnification of a pattern image having been formed cannot be changed, the pattern image cannot be optically enlarged or reduced. That is, since an object surface is disposed to the focal point of an objective lens in the conventional optical system, the light beam emitted from the objective lens is made afocal. Thus, even if the imaging lens is moved, magnification cannot be changed. To change the magnification, the imaging lens must be composed of a group of a plurality of lenses.

Further, a pattern reading apparatus using the above conventional filtering optical system cannot be easily used when the object to be read is intended to function as a prism (i.e., has a wedge shape or the like) for deflecting a light beam. In this case, the image of the point light source will not be shaded by a spatial filter because the image will be formed at a position outside of the axis. Thus, a component of light other than the scattered reflected component will be incident on an imaging lens and a desired filtered output image cannot be output. A similar problem also may arise when a reflection surface is tilted at the time a pattern is read by this type of apparatus.

SUMMARY OF THE INVENTION

A first object of the present invention is to provide a pattern reading apparatus capable of forming a high-contrast image of an indistinct pattern such as a serial number or the like formed on a mirror surface such as a silicon wafer, and in particular, capable of even reading a pattern which has deteriorated because of processing such as etching, vapor evaporation, and the like.

A second object of the present invention is to provide a pattern reading apparatus capable of reading a pattern image even if a portion of an illumination light beam is reflected at the lens surface of an objective lens or even if an object surface is somewhat irregular.

A third object of the present invention is to provide a pattern reading apparatus, which includes a filtering optical system, capable of shading the light beam that forms the image of a point light source without lowering the quantity of light of the pattern image substantially, even if the image of the point light source is expanded due to spherical aberration, coma, and curvature of field of an objective lens.

A fourth object of the present invention is to provide a pattern reading apparatus using a filtering optical system in which the magnification of a pattern image may be changed using a simple structure.

A fifth object of the present invention is to provide a pattern reading apparatus, using a filtering optical system, with which an image of a point light source and a shading region of a spatial filter can be made to coincide, even if an object has a function of a prism or even if a reflection type object has a tilted reflection surface.

According to an aspect of the present invention, there is provided, a pattern reading apparatus including a minute-area light source, an objective lens, an imaging lens, and an imaging element. The objective lens causes the illumination light beam from the light source to be incident on a reflection surface having a pattern formed thereon as an object to be read and converges the light beam reflected from the reflection surface. The imaging lens is for imaging an image of the pattern by a scattered reflected component, which has passed through the objective lens, of the reflected light beam. The imaging element is disposed at a position where the image of the pattern is imaged for reading the pattern. The light source is optically conjugate with a center of curvature of the surface of the object to be read through the objective lens.

According to another aspect of the present invention, there is provided, a pattern reading apparatus including illumination means for illuminating a reflection surface having a pattern formed thereon as an object to be read by a parallel light beam and detection means for detecting an image by imaging a scattered reflected component of illumination reflected from the reflection surface.

According to yet another aspect of the present invention, there is provided, a pattern reading apparatus, an objective lens, a spatial filter, and an imaging lens. The imaging lens forms the image of the pattern using the light beam that passes through the spatial filter. The pattern reading apparatus includes a minute-area light source for causing an illumination light beam to be incident on an object surface having a pattern formed thereon as an object to be read. The objective lens converges a light beam carrying the information of the pattern. The spatial filter is disposed at a position where a size of an image of the light source formed by the objective lens is smaller than a size of the image at a paraxial image point. The spatial filter has a shading region for shading a portion of the light beam that forms an image of the light source from the light beam.

According to yet another aspect of the present invention, there is provided, a pattern reading apparatus including a minute-area light source, an objective lens for converging a light beam having the information of the pattern, a spatial filter, and an imaging lens for forming the image of the pattern by the light beam having passed through the spatial filter. The minute-area light source causes an illumination light beam to be incident on an object surface having a pattern formed thereon as an object to be read. The spatial filter is disposed nearer to the objective lens than the paraxial image point of the image of the light source. The spatial filter also has a shading region for shading the light beam for forming the image of the light source which is contained in the light beam having passed through the objective lens.

According to yet another aspect of the present invention, there is provided, a pattern reading apparatus including a minute-area light source, an objective lens, a spatial filter, an imaging lens, and an imaging element disposed at the imaging position of the pattern image for reading the pattern. The objective lens causes the illumination light beam from the minute-area light source to be incident on an object surface having a pattern formed thereon as an object to be read and converges the light beam reflected at the object surface. The spatial filter is disposed nearer to the objective lens than the paraxial image point of the light source formed through the objective lens for capturing the scattered reflected component which is contained in the reflected light beam having passed through the objective lens. The imaging lens forms an image of the pattern by the component having passed through the spatial filter.

According to yet another aspect of the present invention, there is provided, a pattern reading apparatus using a Fourier conversion optical system composed of a first lens, an object surface to be read, a second lens, a spatial filter, and an imaging surface which are disposed along the traveling direction of the light beam from a light source. The spatial filter is disposed nearer to the second lens than the back focal point of the second lens.

According to yet another aspect of the present invention, there is provided, a pattern reading apparatus for causing a light beam emitted from a light source to be incident on an object surface. The object surface has a pattern formed thereon as an object to be read through an objective lens. The pattern reading apparatus is also for converging the light beam reflected at the object surface through the objective lens as well as reading the image of the pattern by forming the image by an imaging lens. Also provided is a tilt mechanism for supporting the objective lens such that the objective lens is rotatable about a rotation axis which is perpendicular to the optical axis of the objective lens.

According to yet another aspect of the present invention, there is provided, a pattern reading apparatus including a minute-area light source, an objective lens, a spatial filter, an imaging lens, an imaging element, and a tilt mechanism. The objective lens causes the illumination light beam from the light source to be incident on an object surface having a pattern formed thereon as an object to be read and converges the light beam reflected at the object surface. The spatial filter captures the scattered reflected component which is contained in the reflected light beam having passed through the objective lens. The imaging lens images the image of the pattern by the component having passed through the spatial filter. The imaging element is disposed at the imaging position of the pattern image for reading the pattern. The tilt mechanism supports the objective lens to allow turning about a turning axis which is perpendicular to the optical axis of the objective lens.

According to yet another aspect of the present invention, there is provided, a pattern reading apparatus for causing the illumination light beam emitted from a minute-area light source to be incident on an object surface through a first lens. The object surface has a pattern formed thereon as an object to be read. The pattern reading apparatus has a second lens that converges a light beam having the information of the pattern and causes the converging light beam to be incident on an imaging lens. The pattern reading apparatus is for forming the image of the pattern by the imaging lens and reading the formed image. A tilt mechanism is provided for supporting the second lens to allow turning about a turning axis which is perpendicular to the optical axis of the second lens.

According to yet another aspect of the present invention, there is provided, a pattern reading apparatus for causing the illumination light beam emitted from a minute-area light source to be incident on an object surface. The object surface has a pattern formed thereon as an object to be read. The pattern reading apparatus has an objective lens for converging a light beam having the pattern information. The pattern reading apparatus also causes the converging light beam to be incident on an imaging lens, which forms the image of the pattern, and reads the image. The objective lens is disposed such that the light beam originating from a point of the object surface and emitted from the objective lens is changed to a non-parallel light beam. The imaging lens and an imaging surface are made movable along the optical axis direction of the imaging lens in order to change magnification.

According to yet another aspect of the present invention, there is provided, a pattern reading apparatus including a minute-area light source, an objective lens, a spatial filter, and an imaging element. The objective lens causes the illumination light beam from the light source to be incident on an object surface, having a pattern formed thereon as an object to be read, and converges the light beam reflected at the object surface. The spatial filter is for capturing a scattered reflected component which is contained in the reflected light beam having passed through the objective lens. The imaging element is disposed at the imaging position of the pattern image for reading the pattern. The imaging lens and the imaging element are movable along the optical axis direction of the imaging lens in order to change magnification.

According to yet another aspect of the present invention, there is provided, a pattern reading apparatus for causing the illumination light beam emitted from a minute-area light source to be incident on an object surface, having a pattern formed thereon as an object to be read. The pattern reading apparatus also has an objective lens that converges a light beam having the pattern information and causes the converged light source to be incident on an imaging lens. The imaging lens forms the image of the pattern. The pattern reading apparatus is also for reading the image and includes an adjustment mechanism for adjusting the position of the light source in a plane which is perpendicular to the principal beam of the illumination light beam.

According to yet another aspect of the present invention, there is provided, a pattern reading apparatus for causing the illumination light beam emitted from a minute-area light source to be incident on an object surface having a pattern formed thereon as an object to be read. An objective lens converges a light beam having the pattern information. The light beams that pass through the objective lens are incident on an imaging lens through a spatial filter. The imaging lens forms the image of the pattern. The image is also read. The spatial filter is a filter having a shading region for shading paraxial rays. The apparatus includes an adjustment mechanism for adjusting the relative positional relationship between the position of the image of the light source formed by the objective lens and the shading region of the spatial filter in the plane which crosses the optical axis of the imaging lens.

According to yet another aspect of the present invention, there is provided, a pattern reading apparatus including a minute-area light source disposed to cause an illumination light beam to be obliquely incident on an approximately flat object surface having a pattern formed thereon as an object to be read at a predetermined incident angle. The pattern reading apparatus also includes an objective lens for converging a light beam having the information of the pattern, a spatial filter having a shading region for shading the portion of the reflected light beam from the object surface which has passed through the spatial filter and forms the image of the light source, and an imaging element. The imaging element is for reading the image of the pattern formed by the light beam having passed through the spatial filter. The line extending from the principal plane of a lens interposed between the object surface and an imaging surface and having an imaging action, the line extending from the imaging surface and the line extending from the object surface cross each other on an approximately straight line.

According to yet another aspect of the present invention, there is provided, a pattern reading apparatus including a minute-area light source for illuminating an object surface having a pattern formed thereon as object to be read. The pattern reading apparatus also includes an objective lens for converging a light beam having the pattern information, a spatial filter and a shift mechanism. The spatial filter has a shading region for shading the light beam, which forms the image of the light source, of the light beam having passed through the objective lens. The shift mechanism is for supporting the objective lens so as to allow parallel movement in a direction approximately perpendicular to the optical axis of the objective lens. The image of the pattern formed by the component having passed through the spatial filter is read.

According to yet another aspect of the present invention, there is provided, a pattern reading apparatus including a minute-area light source disposed such that an illumination light beam is caused to be incident on an object surface having a pattern formed thereon as a object to be read without passing through a lens. The pattern reading apparatus also includes an objective lens for converging a light beam having the pattern information, a spatial filter, and an imaging element. The spatial filter has a shading region for shading the portion, which forms the image of the light source, of the light beam having passed through the objective lens. The imaging element is for reading the image of the pattern formed by the light beam having passed through the spatial filter.

According to yet another aspect of the present invention, there is provided, a pattern reading apparatus including an objective lens disposed in confrontation with an object surface as a reflection surface having a pattern formed thereon as an object to be read. The pattern reading apparatus includes a minute-area light source disposed at a position which is conjugate with the center of curvature of the object surface through the objective lens for illuminating the object surface through the objective lens. The pattern reading apparatus also includes an imaging lens and an imaging element. The imaging lens is disposed farther from the object surface than the light source with the optical axis thereof in coincidence with the objective lens. The imaging element is for reading the image of the pattern which is reflected at the object surface and formed through the objective lens and the imaging lens.

BRIEF DESCRIPTION OF THE ACCOMPANYING DRAWINGS

Figure 10A:
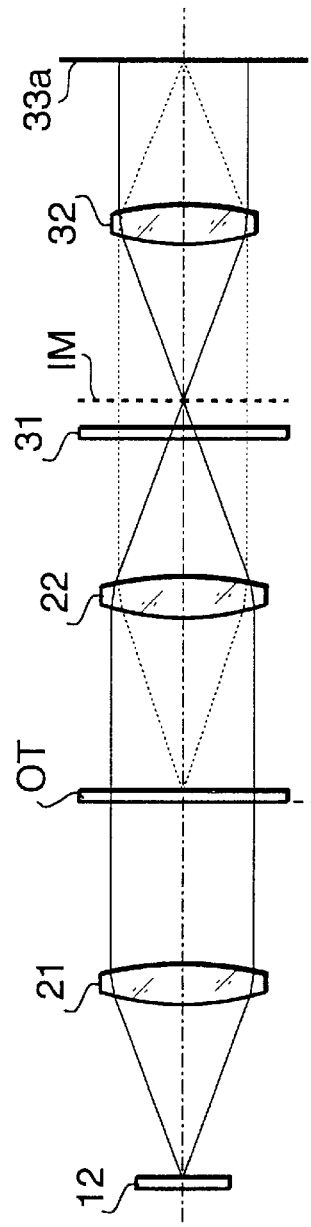
FIG. 10(A) shows an optical system of a pattern reading apparatus according to a second embodiment.
Figure 10B:
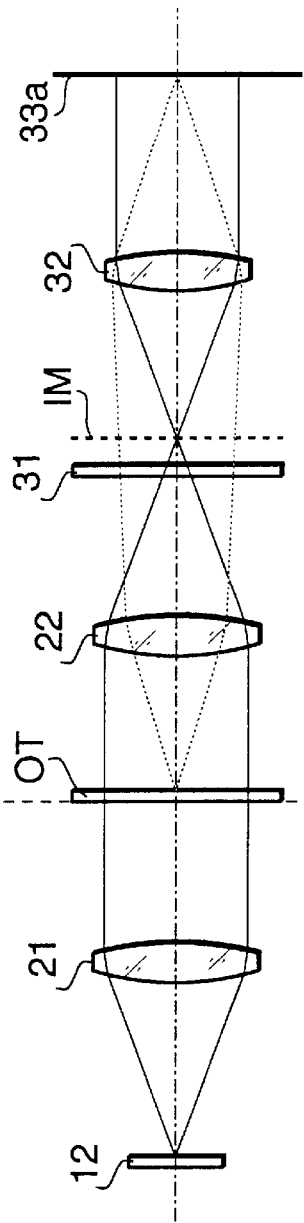
Figure 10C:
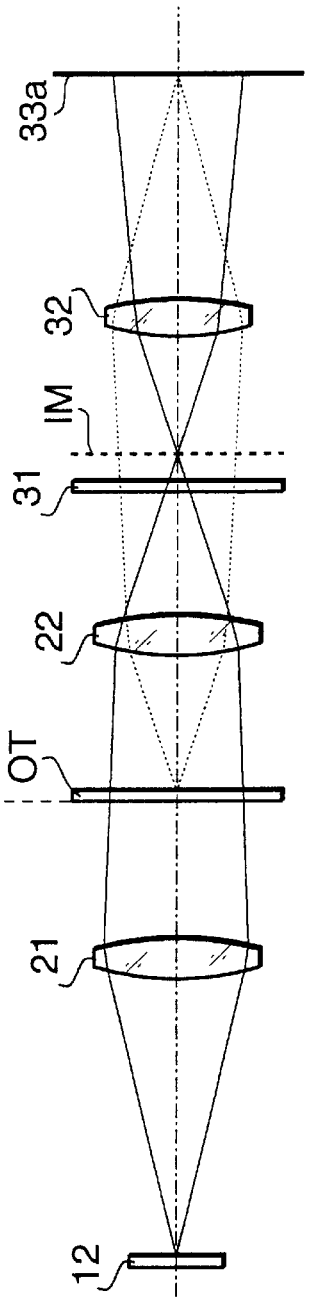
Figure 11A:
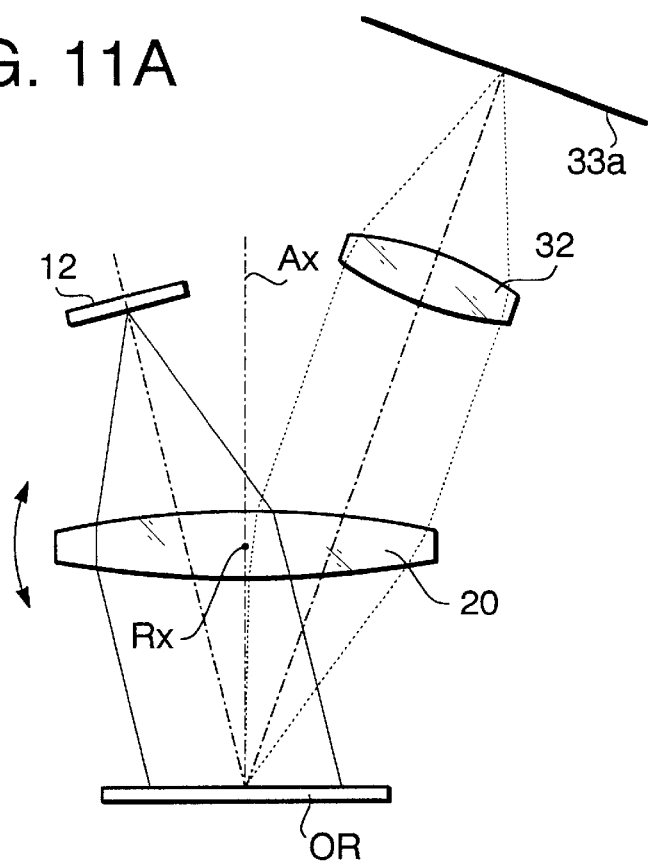
Figure 11B:
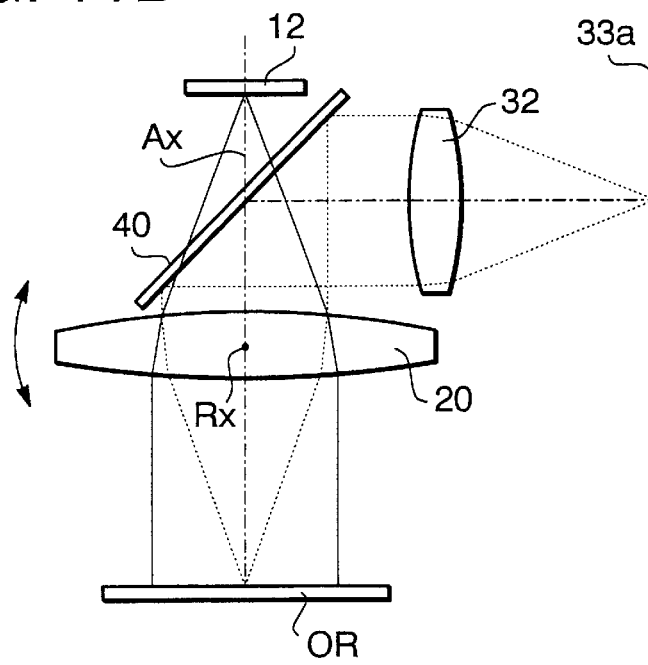
Figure 13A:
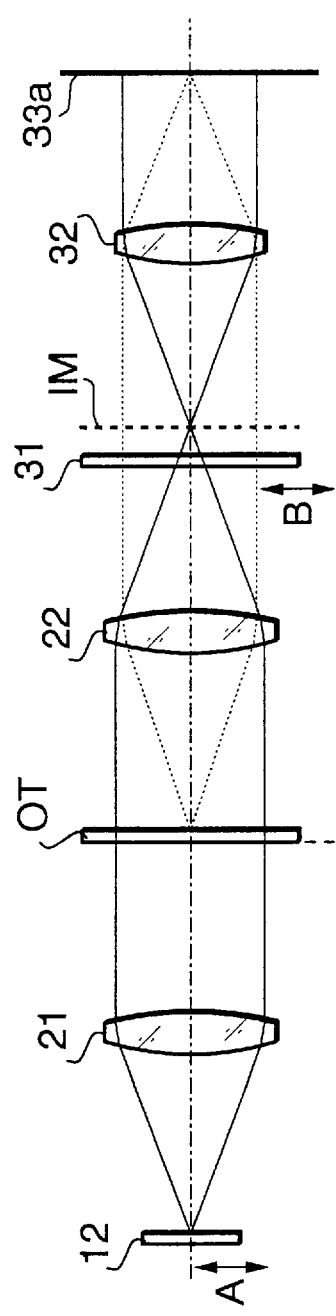
Figure 13B:
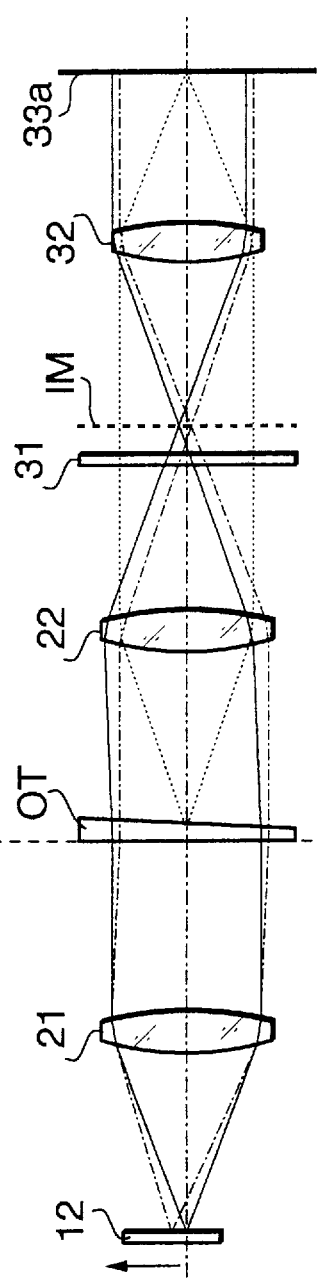
Figure 13C:
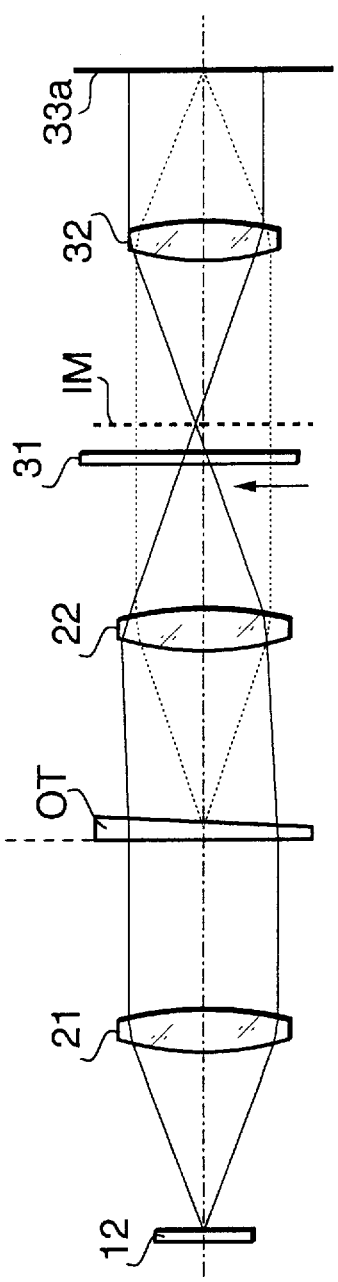
Figure 14:
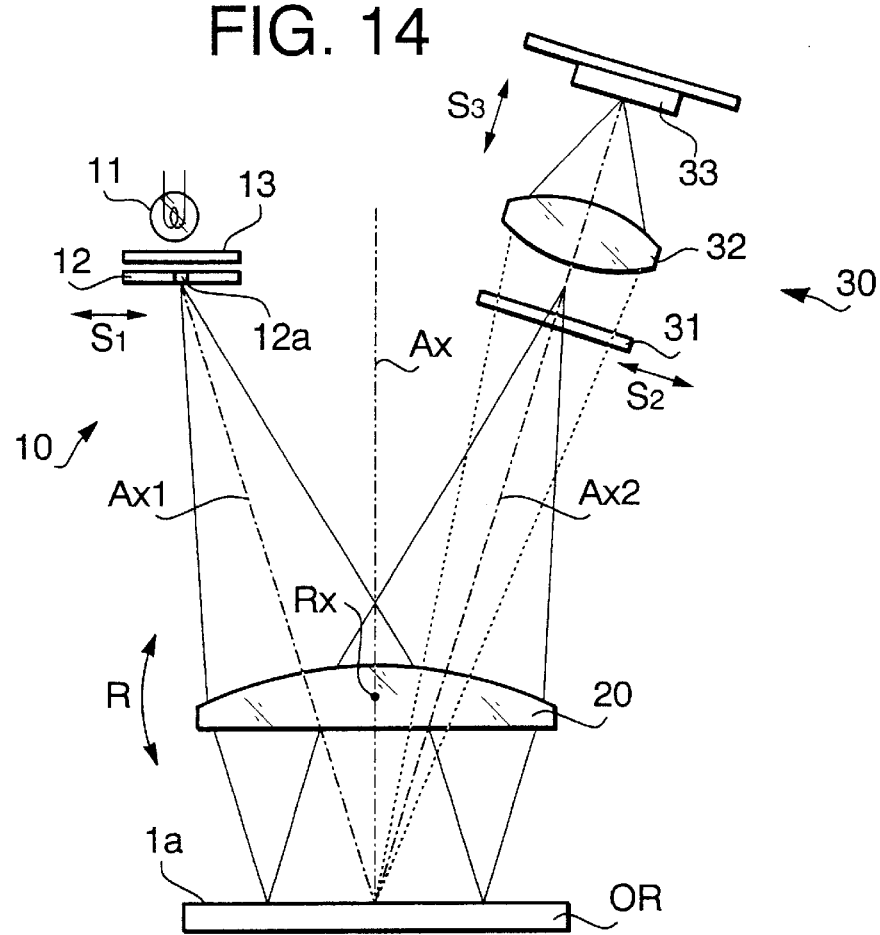
Figure 15:
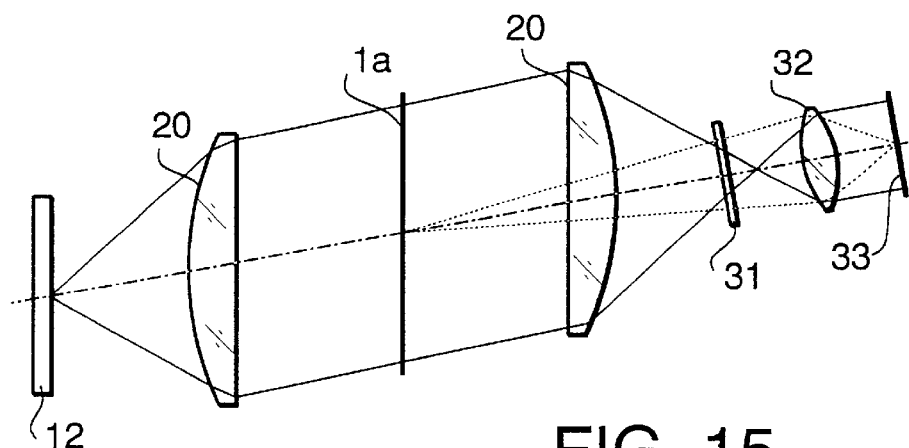
Figure 16:
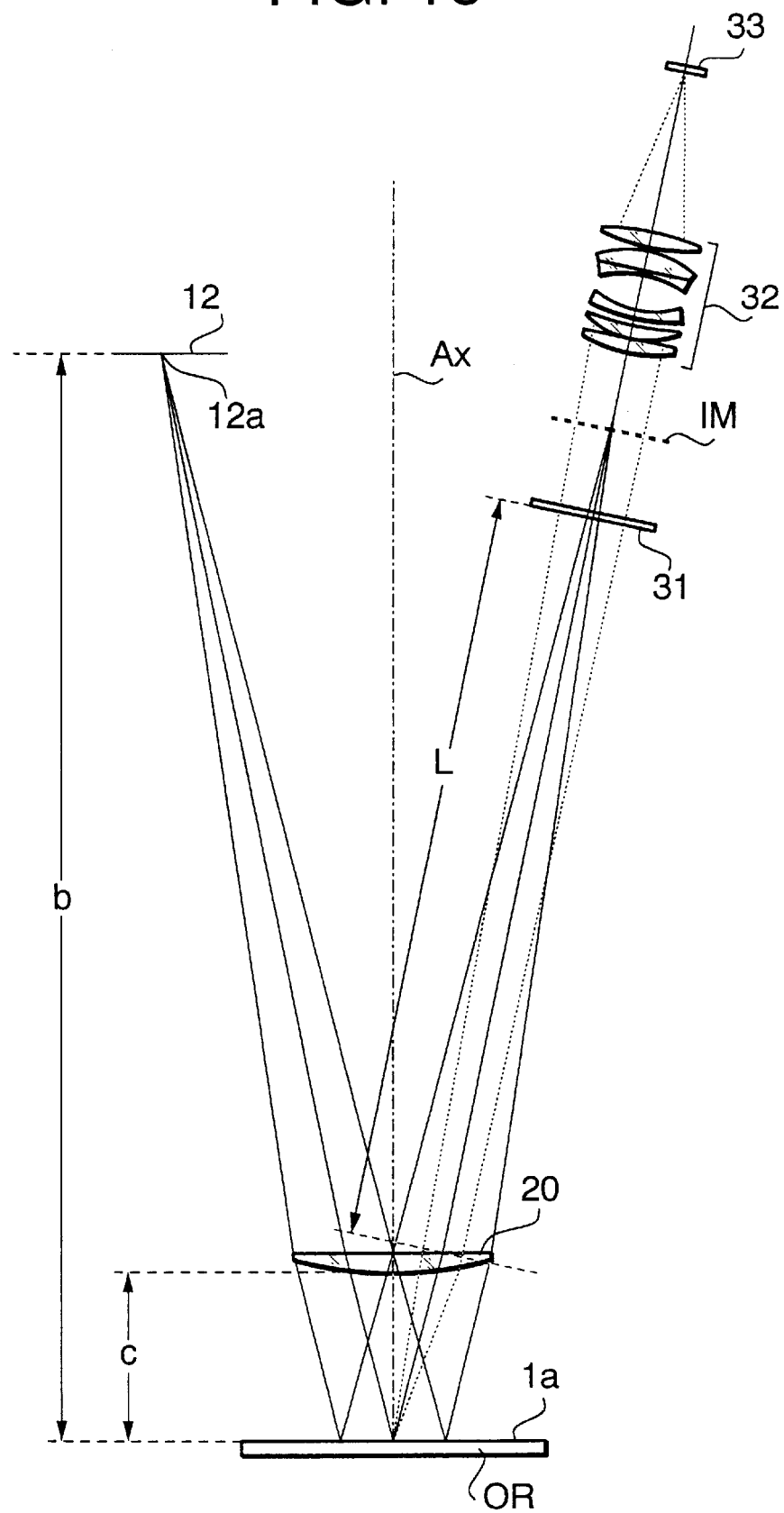
Figure 18:
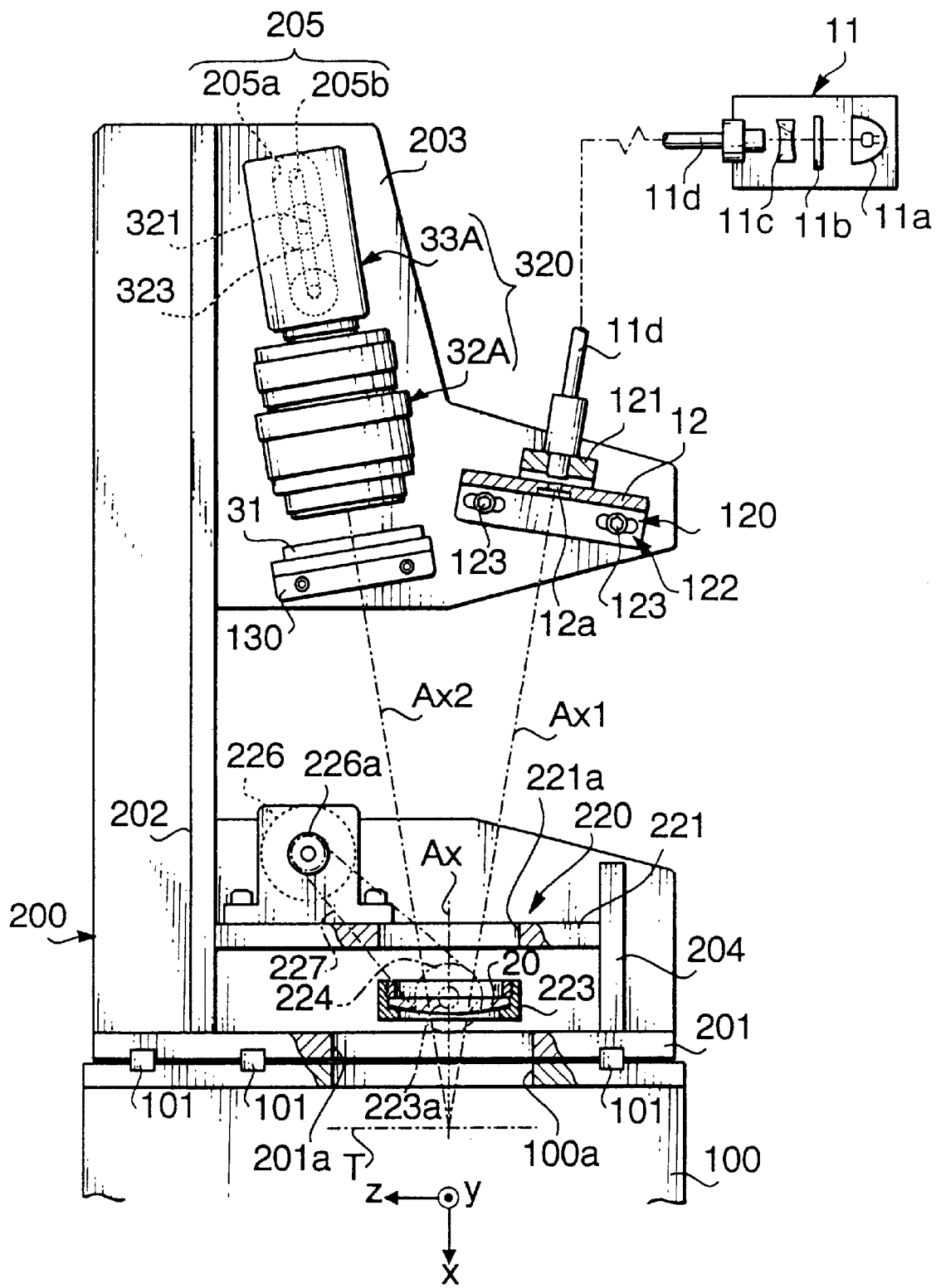
Figure 19:
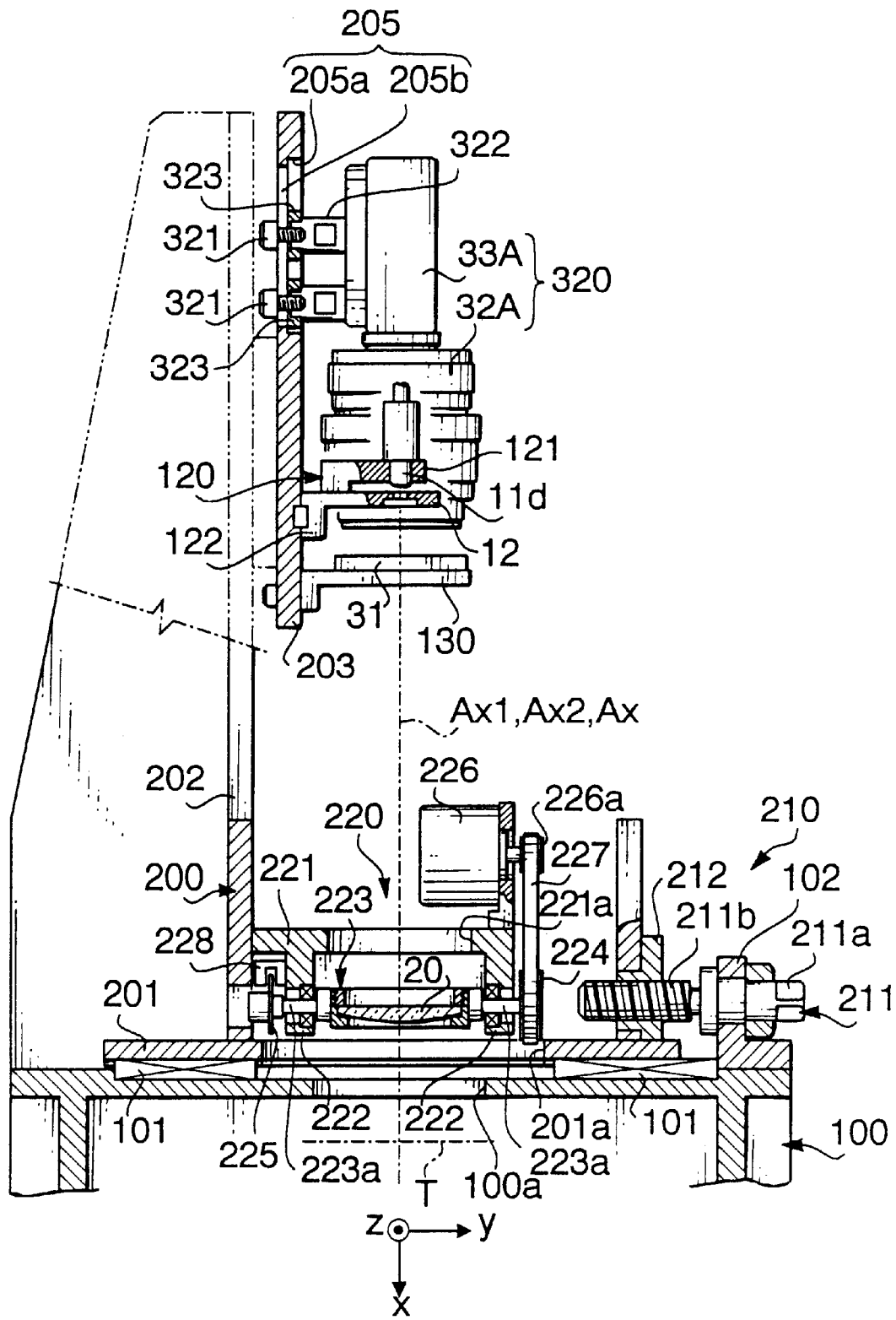
Figure 20:
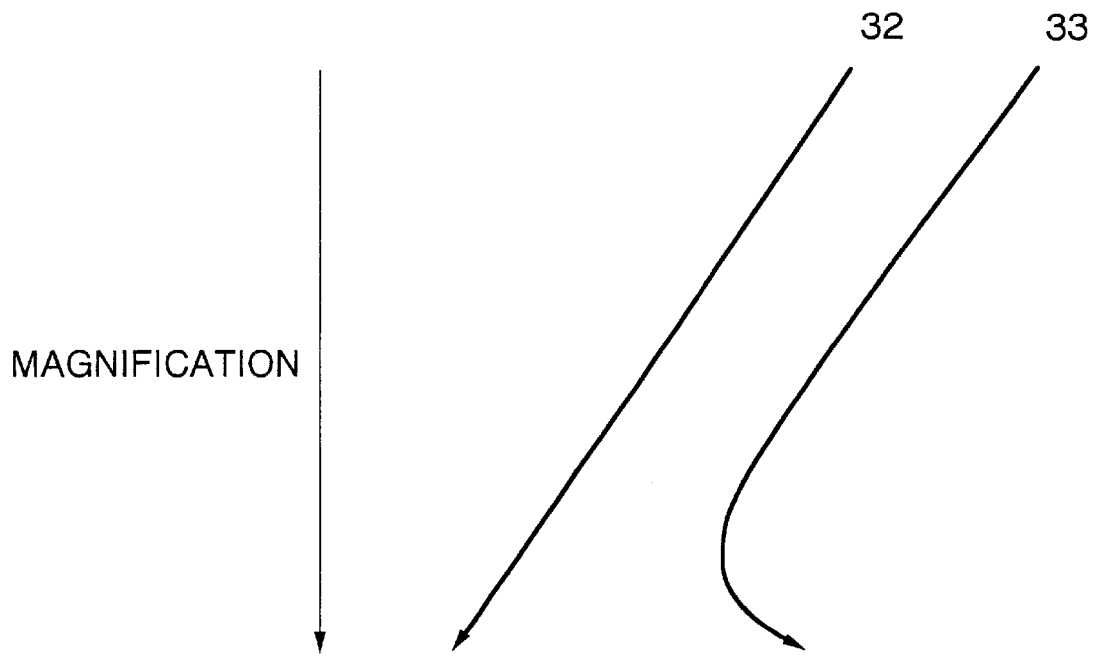
Figure 21:
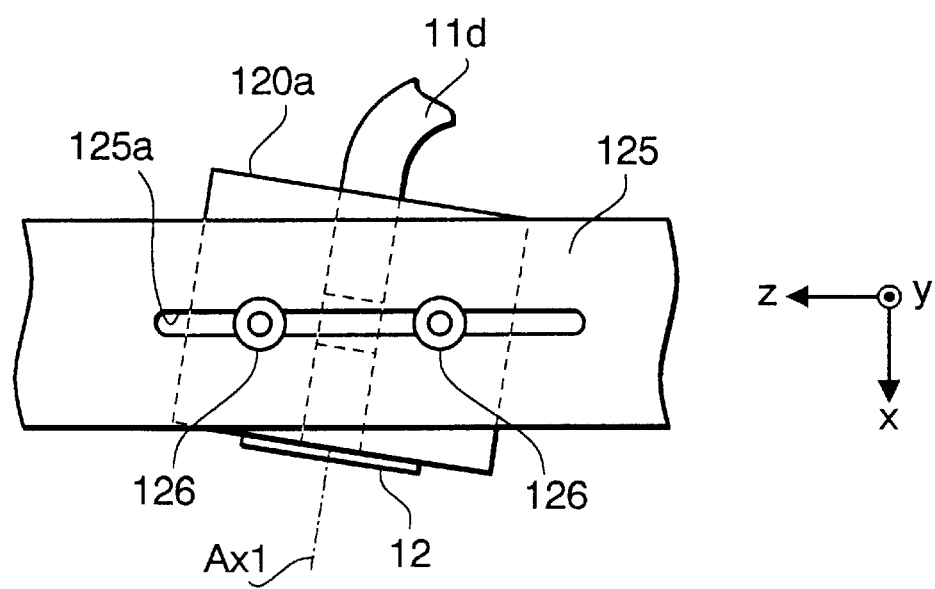
Figure 23:
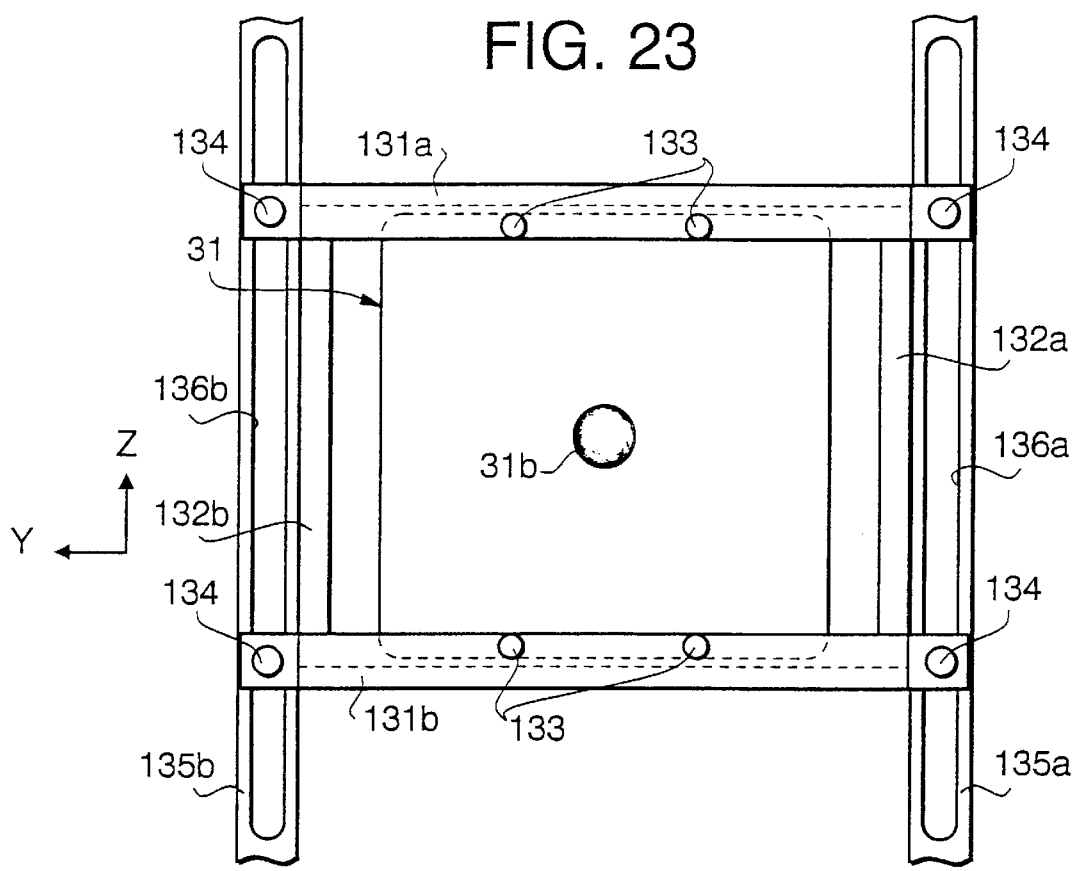
Figure 24:
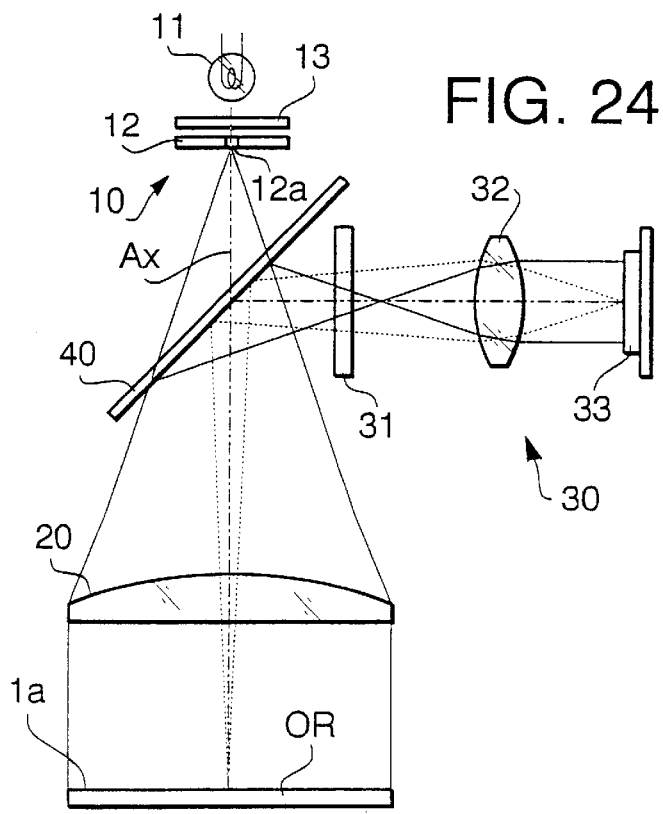
Figure 25A:
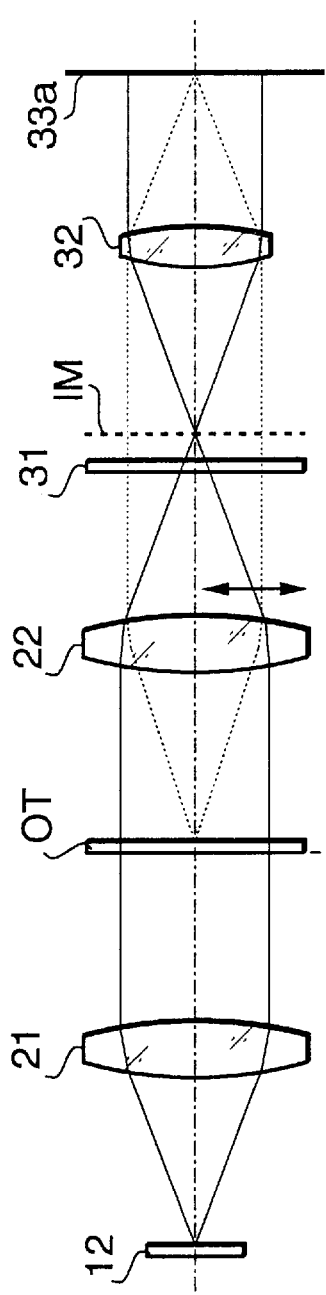
Figure 25B:
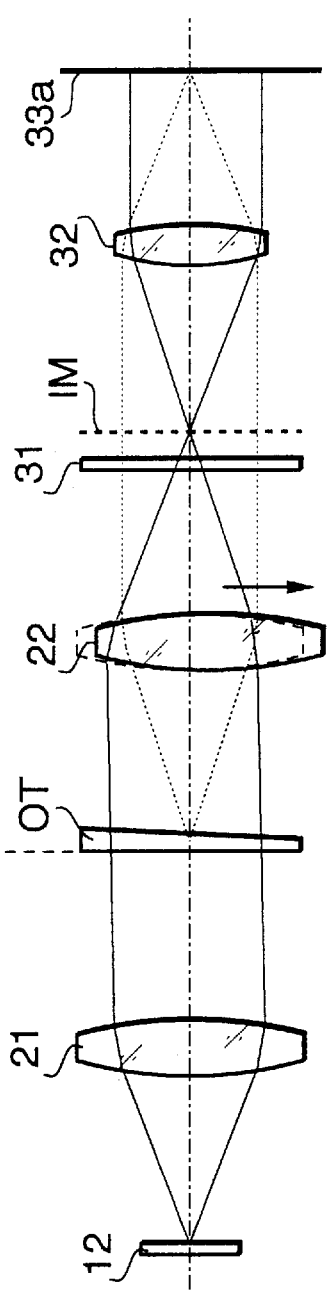
Figure 26:
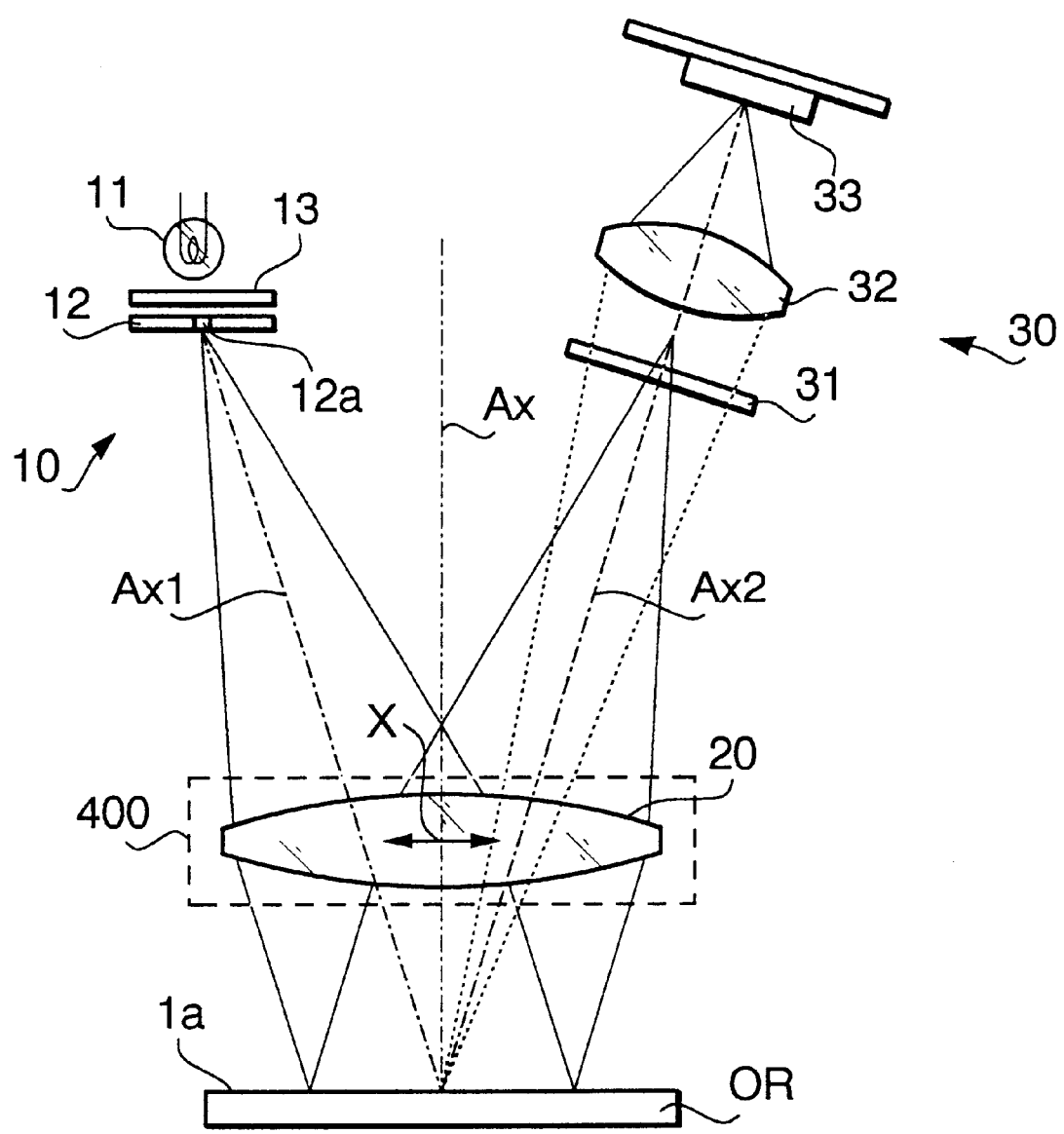
Figure 27:
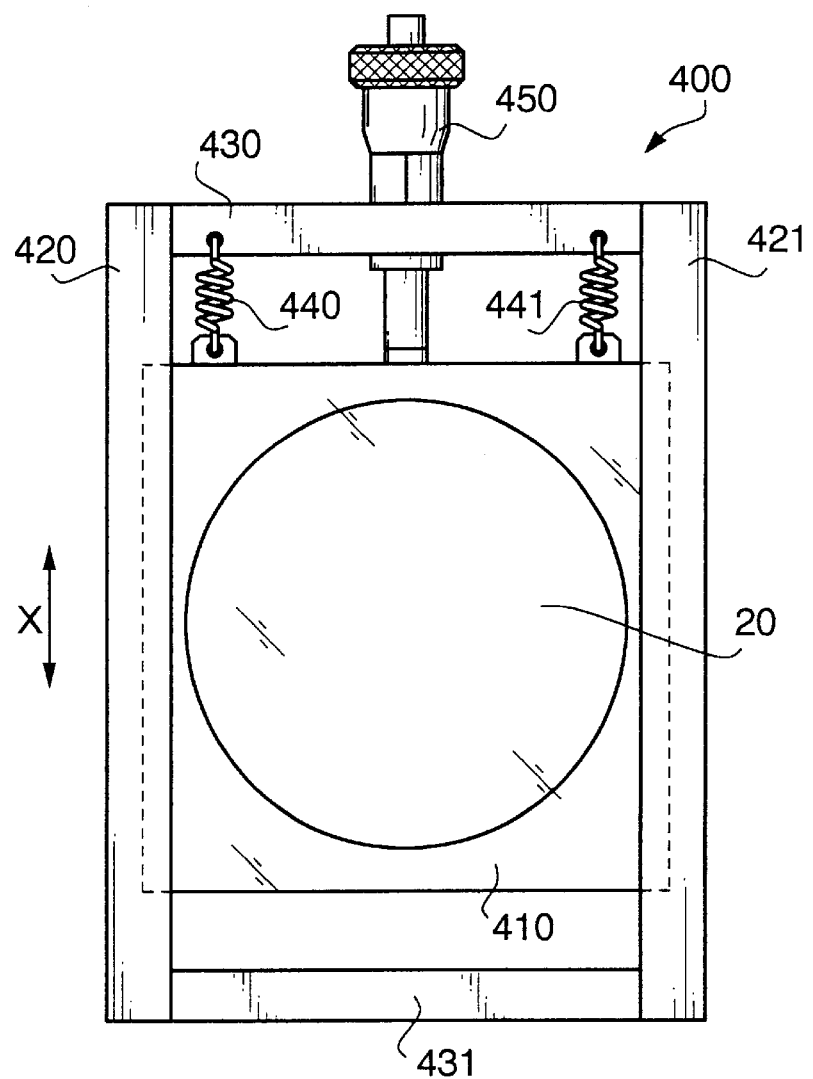
Figure 28:
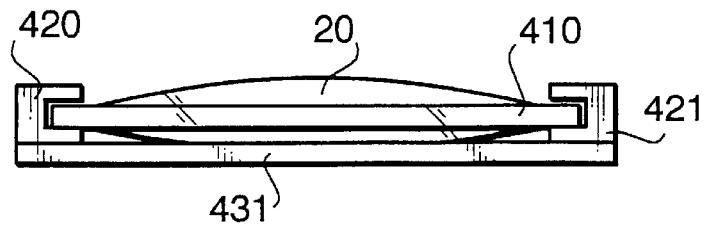
Figure 29:
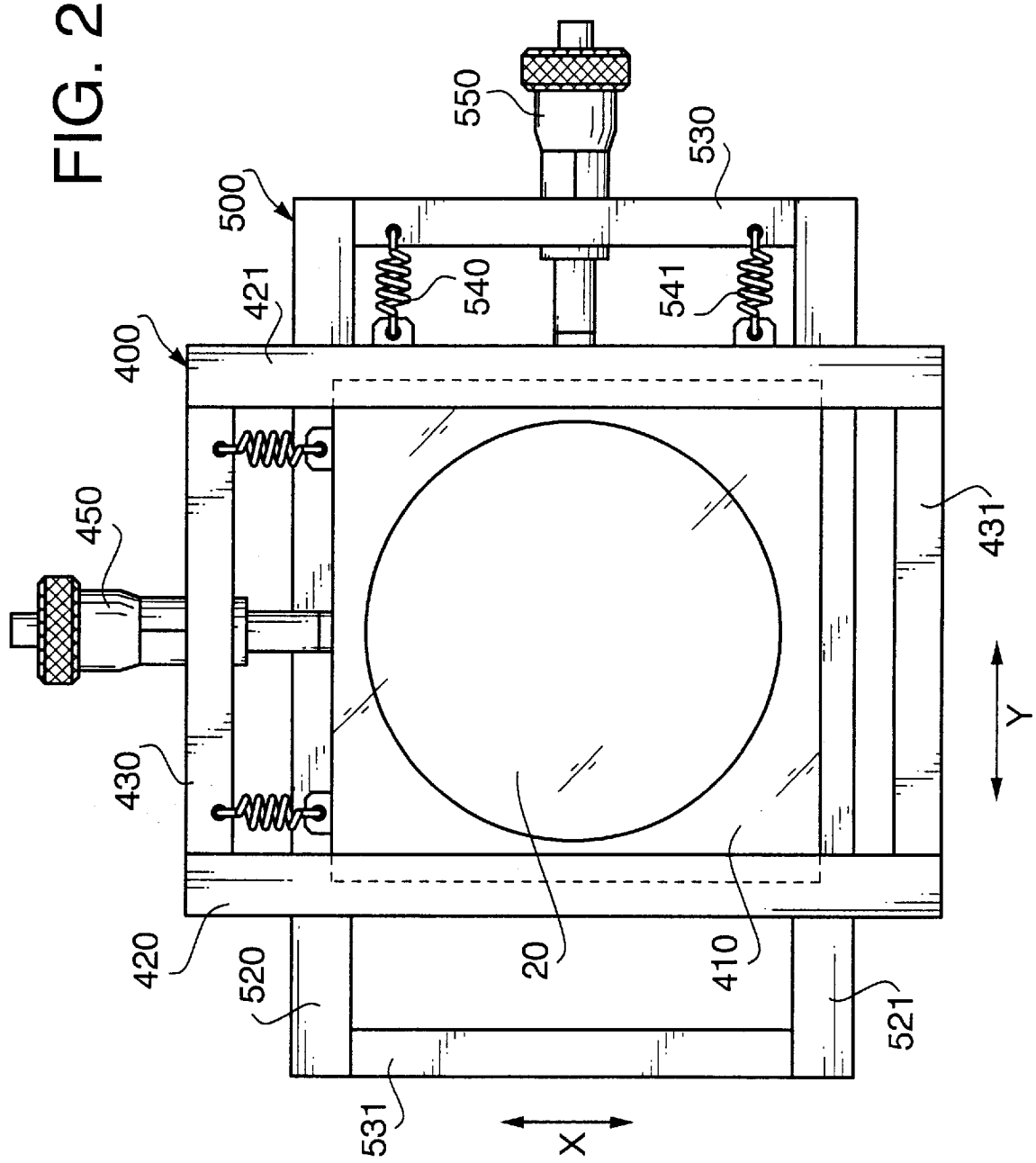
Figure 31:
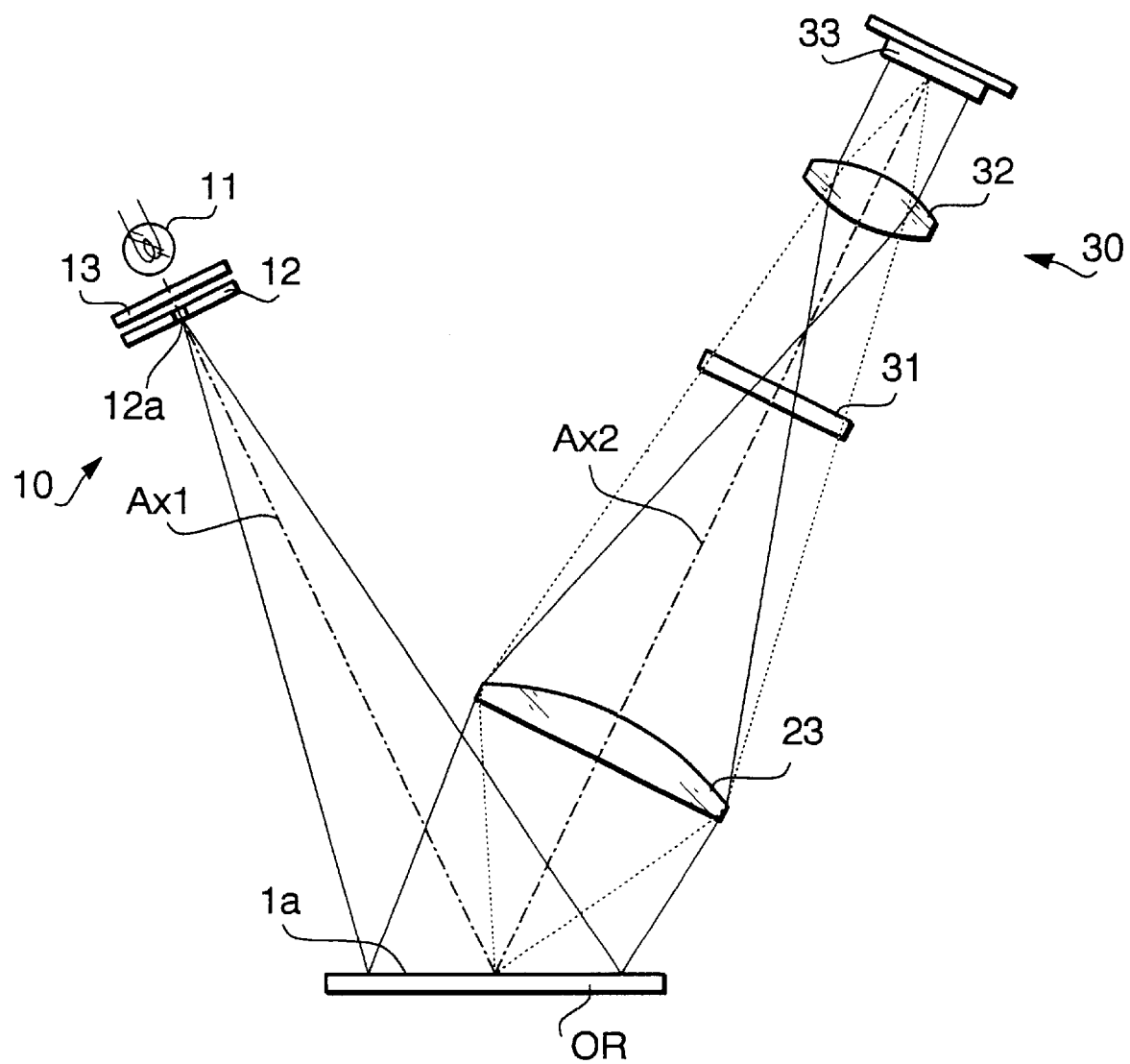
Figure 32:
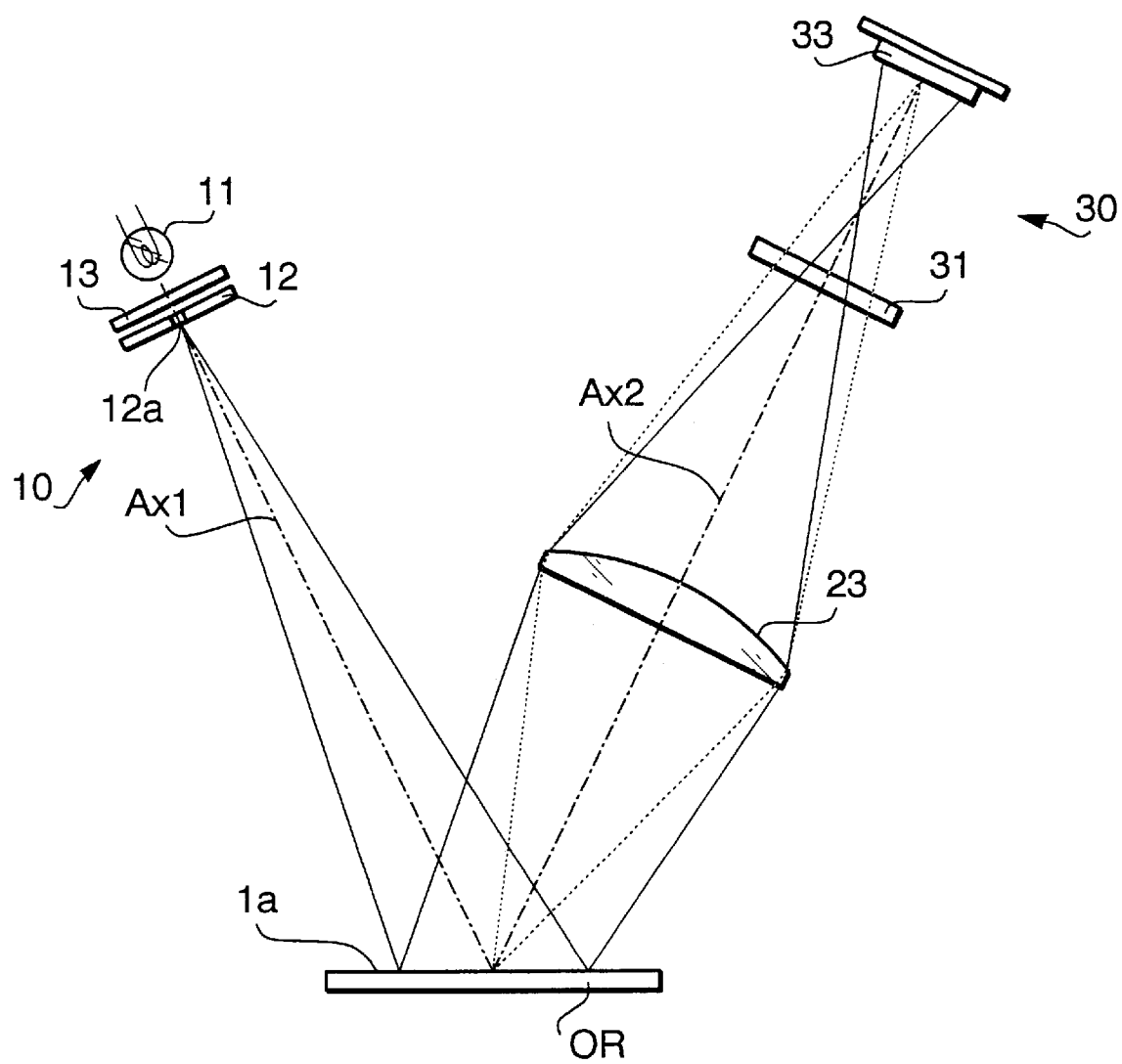
Figure 33:
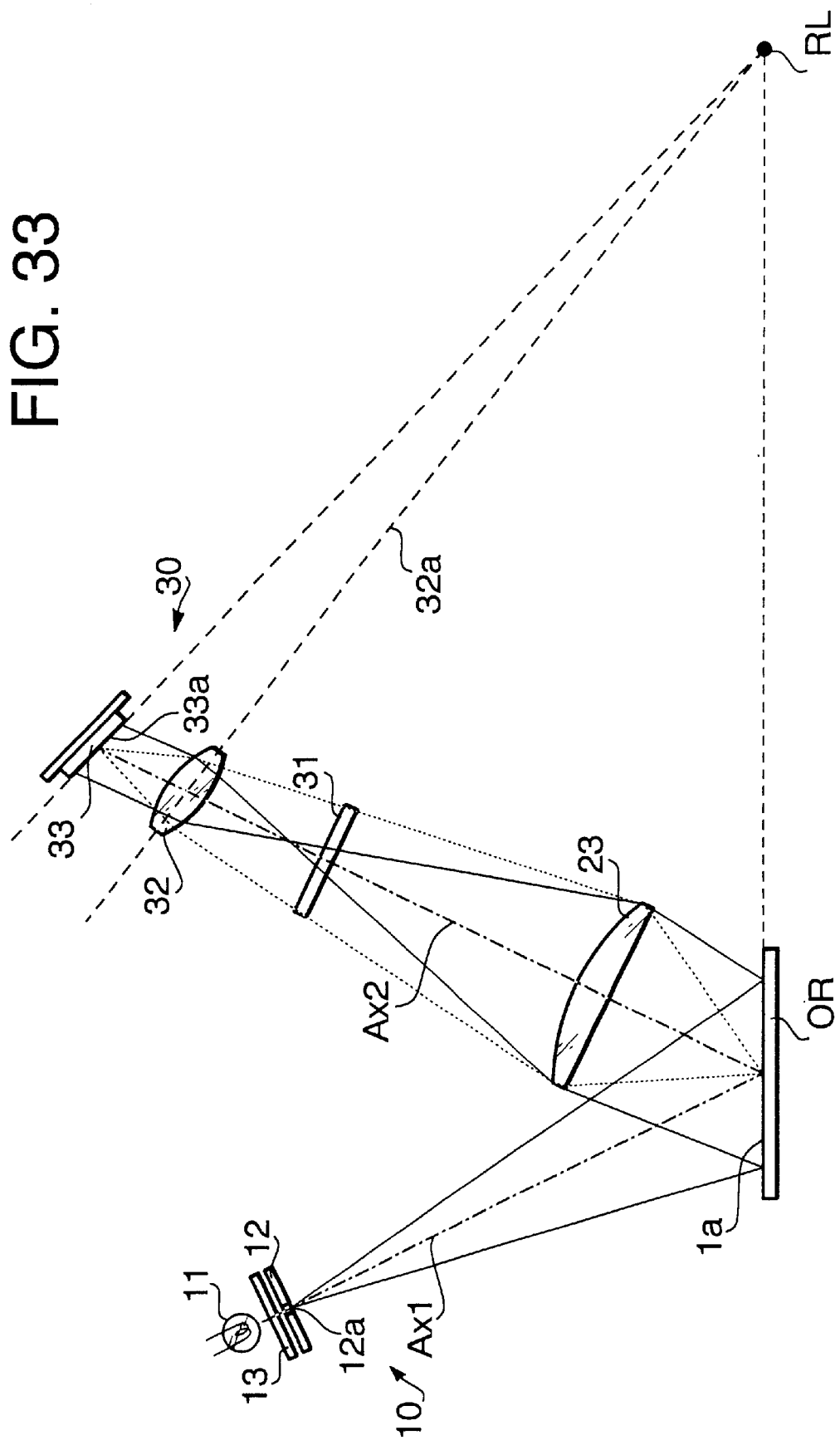
Figure 34:
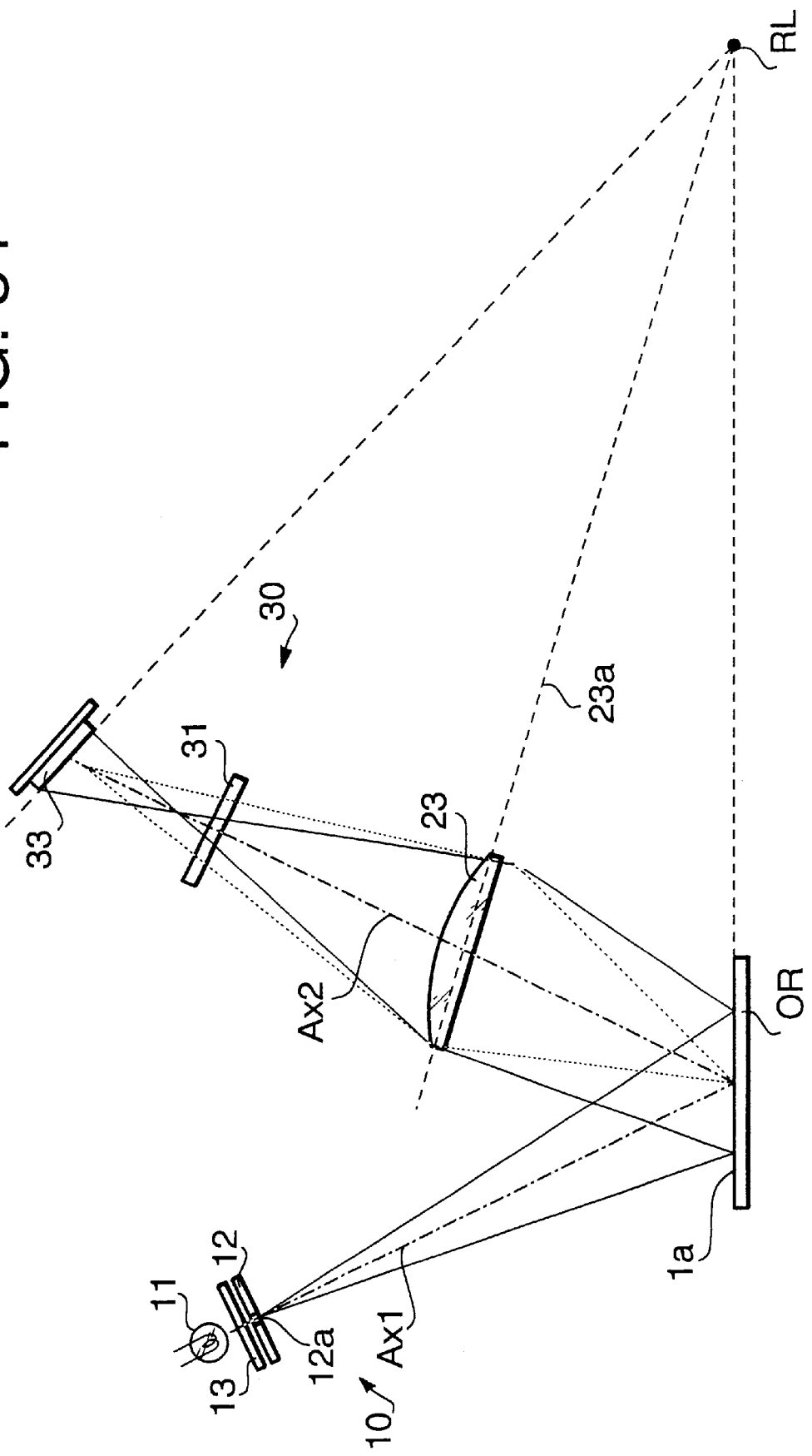
Figure 35:
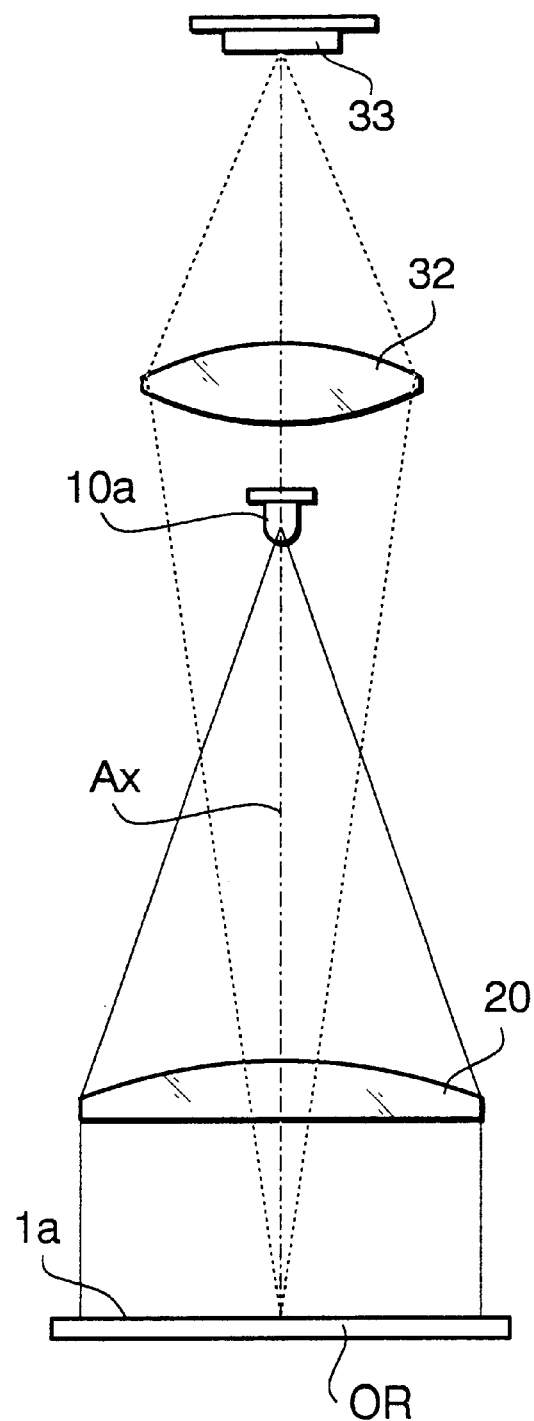
Figure 36:
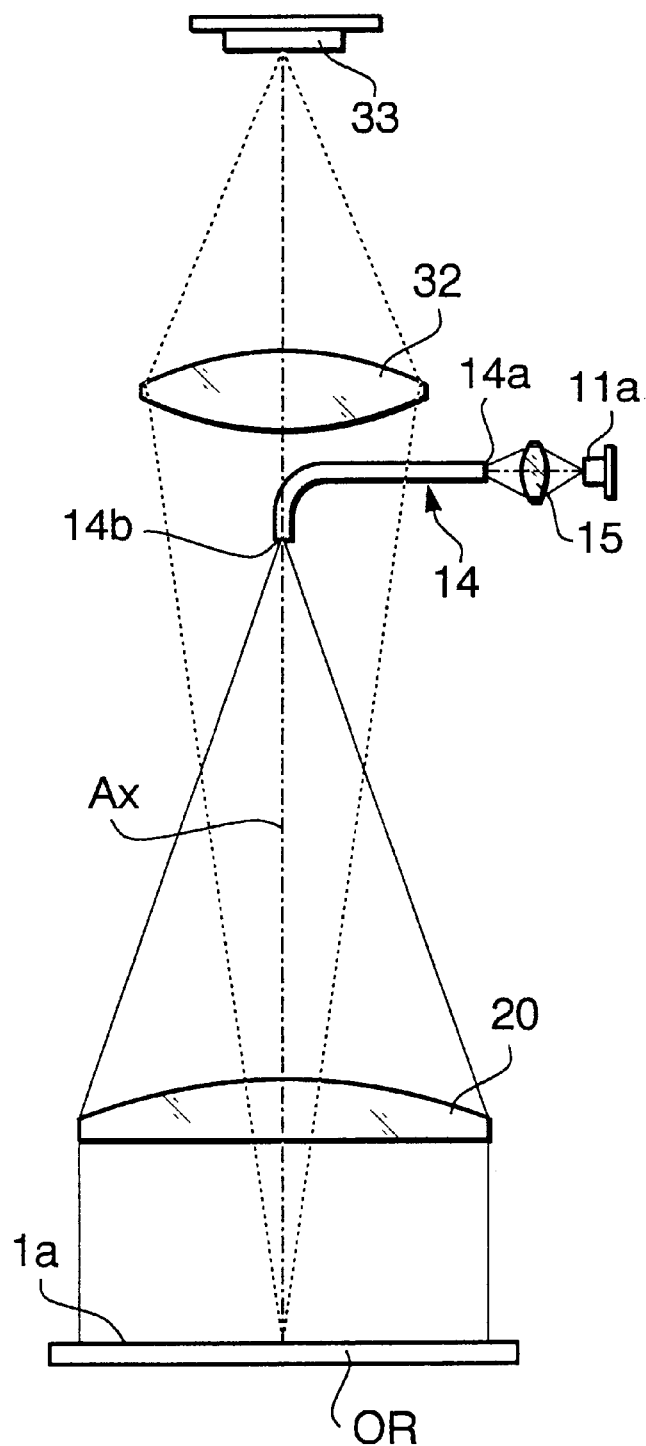

FIGS. 10(B) and 10(C) show a modification of the optical system of FIG. 10(A) for making magnification adjustable;

FIGS. 11(A) and 11(B) show an optical system of a pattern reading apparatus according to a third embodiment;

FIGS. 12(A) and 12(B) show an optical system of a pattern reading apparatus according to a fourth embodiment;

FIGS. 13(A), 13(B), and 13(C) show an optical system of a pattern reading apparatus according to a fifth embodiment;

FIG. 14 shows an optical system of a pattern reading apparatus according to a sixth embodiment;

FIG. 15 shows the optical system of FIG. 14 in a developed form;

FIG. 16 shows a specific arrangement of an optical system according to the sixth embodiment;

FIGS. 17(A) through 17(H) are spot diagrams showing the size of an image of a light source calculated based on the specific arrangement of FIG. 16;

FIG. 18 is a front view of a specific mechanical arrangement of a pattern reading apparatus including the optical system of FIG. 14;

FIG. 19 is a side view showing the apparatus of FIG. 18;

FIG. 20 illustrates the movement loci of an imaging lens and an imaging element for adjusting magnification;

FIG. 21 illustrates an alternative arrangement for adjusting a pinhole unit;

FIGS. 22(A) and 22(B) illustrate an alternative arrangement for adjusting a spatial filter;

FIG. 23 shows the arrangement of FIG. 22 as mounted;

FIG. 24 shows a modification of an optical system according to the sixth embodiment;

FIGS. 25(A) and 25(B) show an optical system of a pattern reading apparatus according to a seventh embodiment;

FIG. 26 shows an optical system of a pattern reading apparatus according to an eighth embodiment;

FIG. 27 is a plan view showing the arrangement of a shift mechanism for moving an objective lens;

FIG. 28 is a side view of the shift mechanism of FIG. 27;

FIG. 29 is a plan view showing an alternative arrangement of the shift mechanism of FIG. 27;

FIG. 30(A) shows an optical system of a pattern reading apparatus according to a ninth embodiment;

FIG. 30(B) shows a modification, of the optical system of FIG. 30(A);

FIG. 31 shows an optical system of a pattern reading apparatus according to a tenth embodiment;

FIG. 32 shows a modification of the optical system of FIG. 31;

FIG. 33 shows an optical system of a pattern reading apparatus according to an eleventh embodiment;

FIG. 34 shows a modification of the optical system of FIG. 33;

FIG. 35 shows an optical system of a pattern reading apparatus according to a twelfth embodiment; and FIG. 36 shows a modification of the optical system of FIG. 35.

DESCRIPTION OF THE PREFERRED EMBODIMENTS

Embodiments of a pattern reading apparatus according to the present invention will be described below.

First Embodiment

Figure 1:
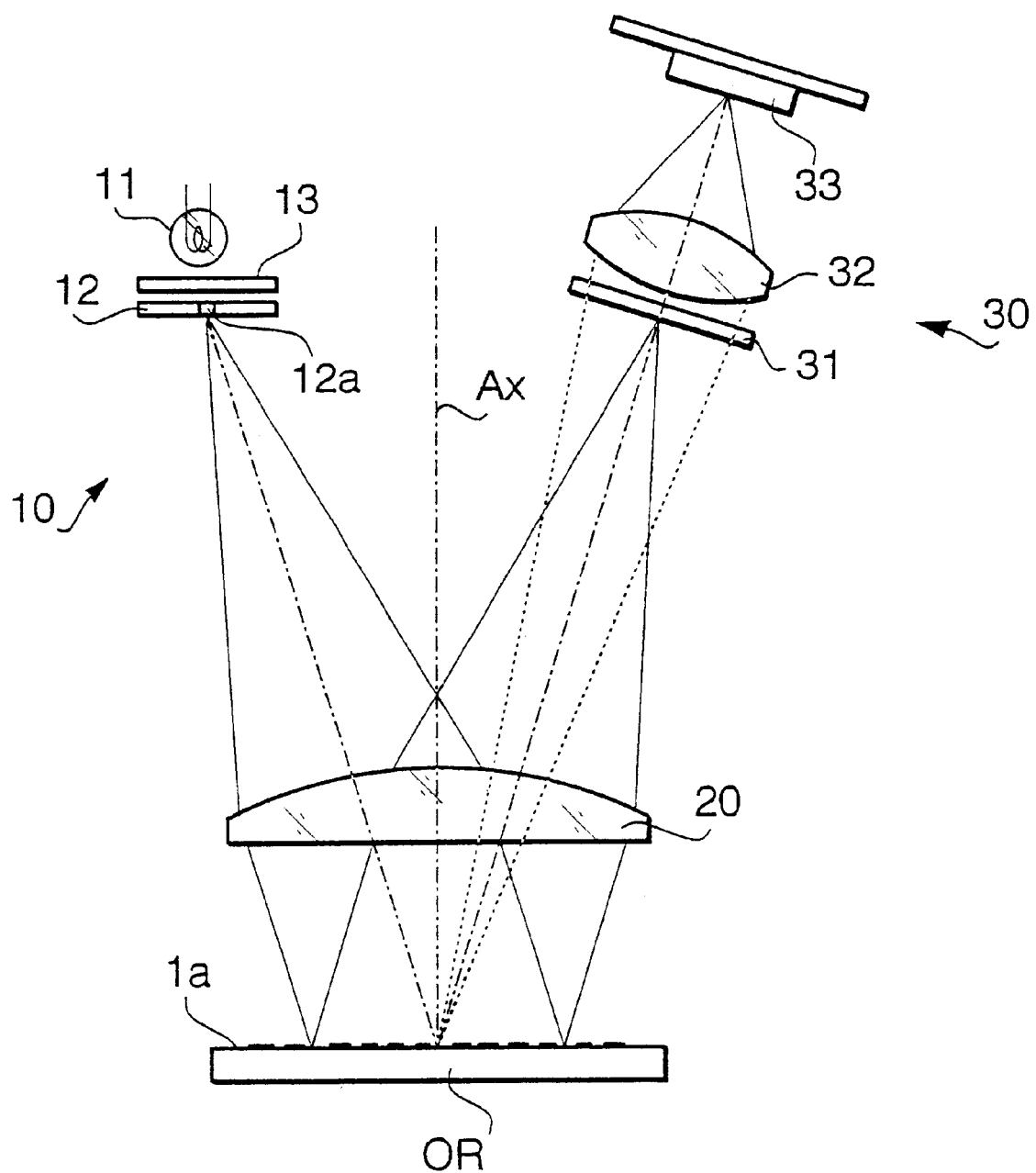
FIG. 1 shows an optical system of a pattern reading apparatus according to a first embodiment.

FIG. 1 is a schematic view showing the arrangement of the pattern reading apparatus according to a first embodiment. As shown in FIG. 1, a silicon wafer OR has a reflective surface 1a on which a pattern (in this case, a serial number) is formed by laser etching. Further, the pattern reading apparatus includes an optical system composed of an illumination unit 10, an objective lens 20 and a detection unit 30. The objective lens 20 is disposed so that the optical axis Ax thereof is perpendicular to the reflective surface 1a. The illumination unit 10 and the detection unit 30 are disposed approximately symmetrically with respect to the optical axis Ax on opposite sides thereof.

The illumination unit 10 includes a lamp 11 such as a halogen lamp, or the like, and a pinhole plate 12 in which a pinhole 12a is formed to permit a portion of the light beam emitted from the light source to pass therethrough to form a minute-area light source (the minute-area light source will also be referred to as a point light source). A diffusion plate 13 is interposed between the lamp 11 and the pinhole plate 12 to eliminate any effect due to an image of a filament of the lamp 11.

The detection unit 30 includes a spatial filter 31, an imaging lens 32, and an imaging element 33, such as a CCD image sensor, or the like. In the embodiment shown in FIG. 1, the detection unit 30 is disposed on a line extending in a direction in which light from the minute-area light source will be specularly reflected from the surface 1a.

The objective lens 20 is designed such that the minute-area light source is conjugate with the center of curvature of an object surface to be read. In this embodiment, since the surface 1a is formed as a plane, the pinhole 12a is disposed at a front focal point position (i.e., a position on a plane which is perpendicular to the optical axis Ax of the objective lens 20, and which includes a front focal point of the objective lens 20) of the objective lens 20. A light beam emitted from the minute-area light source becomes a parallel light beam after passing through the objective lens 20 and obliquely illuminates the surface 1a of the silicon wafer OR. The parallel light beam is scatteringly (diffusely) reflected at edges of the pattern and specularly reflected at portions other than the edges.

Figure 2:
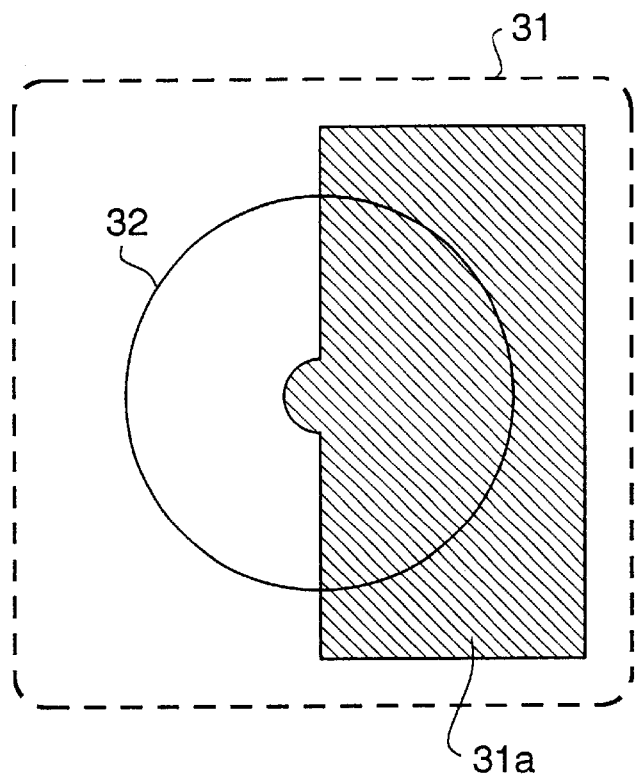
FIG. 2 is a plan view showing an example of a spatial filter.
Figure 3:
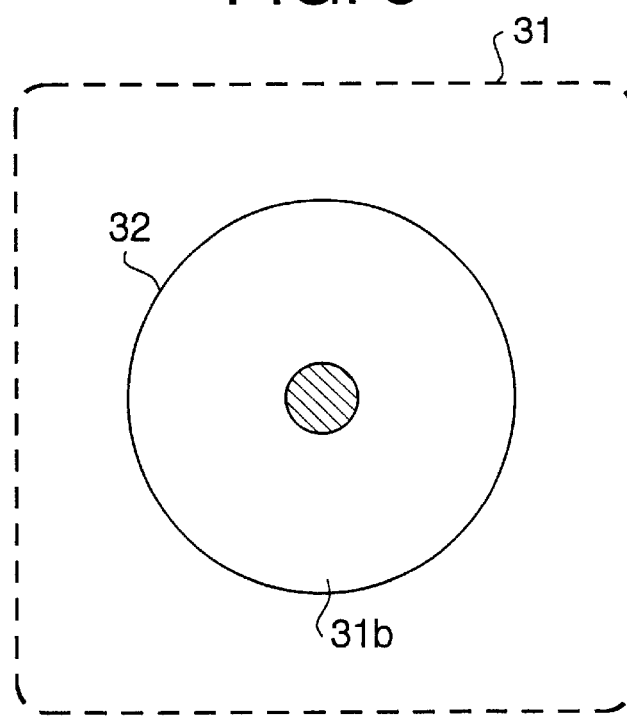
FIG. 3 is a plan view showing another example of a spatial filter.

The reflected light beam passes through the objective lens 20 again, and becomes a converging light beam directed toward the detection unit 30. The spatial filter 31 is disposed at a position where it is conjugate with the minute-area light source through the objective lens 20, that is, at a back focal point position of the objective lens 20 in the optical path between the imaging lens 32 and the objective lens 20 (i.e., a position on a plane which is perpendicular to the optical axis Ax of the objective lens 20, and which includes a back focal point of the objective lens 20). As a result, at the spatial filter 31, a specularly reflected component of the light beam reflected from the surface 1a is converged to a beam spot approximately the same size as the pinhole 12a. As shown in FIGS. 2 and 3, the spatial filter 31 is provided with a shading portion for shading the specularly reflected component. Specifically, as shown in, for example, FIG. 2, the spatial filter 31 has a shading portion 31a for covering the central portion of the pupil of the imaging lens 32 which corresponds to a range on which the specularly reflected light beam is incident and the right half of the pupil of the imaging lens 32. In another example, the spatial filter 31 has, as shown in FIG. 3, a shading portion 31b for covering only the central portion of the pupil of the imaging lens 32 which corresponds to a range on which the specularly reflected light beam is incident. In the above examples, the spatial filter 31 may have a transparent glass plate as shown by broken lines, and the shading portion 31a or 31b is formed by a coating or the like.

The diffusely reflected component of the light beam reflected at the surface 1a (see FIG. 1), which passes through the spatial filter 31, is incident on the imaging lens 32. A power and a position of the imaging lens 32 is designed such that the surface 1a of the silicon wafer OR and the imaging element 33 are conjugate with respect to the imaging lens 32, and, thus, the image of the pattern is formed on the imaging element 33 by the scatteringly (diffusely) reflected component. The imaging element 33 converts the formed image of the pattern into an electric signal and outputs the signal to an image processing apparatus (not shown). The image processing apparatus may display the image of the pattern on a display screen based on the input image signal and/or analyze the content of the pattern using a character recognition algorithm.

In the example in FIG. 1, since the detection unit 30 is disposed on the line extending in the direction in which the specularly reflected component is reflected from the surface 1a, if the spatial filter 31 is not provided, the specularly reflected component will be incident on the imaging lens 32. Since the specularly reflected component does not include information of the pattern and has a strong intensity, if the specularly reflected component is captured by the imaging element 33, the Signal to Noise (S/N) ratio of the information of the pattern is lowered and it is difficult to detect the pattern. To cope with this problem, the S/N ratio of the information of the pattern is improved by removing the specularly reflected component using the spatial filter 31 and permitting the imaging element 33 to capture only the diffusely reflected component so that it is easy to recognize and discriminate the pattern. Because the image formed on the imaging element is mainly formed of a high frequency component of a spatial frequency of the capture image, by suppressing the low frequency component thereof, the edge portion of the captured image of the pattern is actually emphasized.

The focal length of the imaging lens 32 is determined based on a magnification determined in accordance with the length of the pattern (i.e., the length of the serial number) and the size of the imaging surface of the imaging element 33. Further, the focal length of the objective lens 20 is determined based on the distance between the surface 1a and the imaging lens 32, where the distance between the surface 1a and the imaging lens 32 is set according to the focal length of the imaging lens 32 and the magnification.

Figure 4:
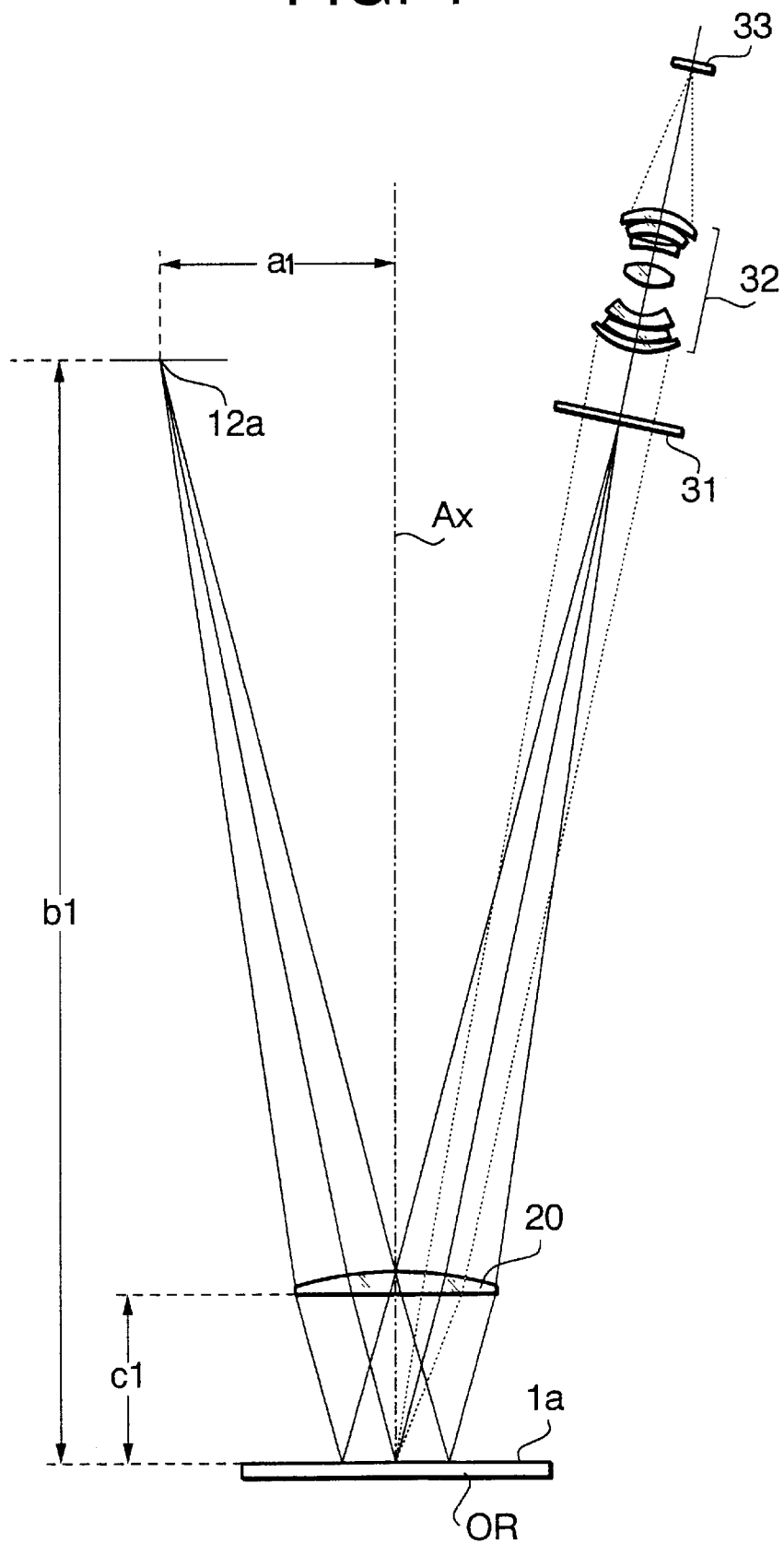
FIG. 4 shows a specific arrangement of an optical system according to the first embodiment.

FIG. 4 illustrates a design example of the pattern reading optical system of a first embodiment. In this example, the imaging lens 32 has a focal length of 28 mm and the objective lens 20 has a focal length of 250 mm. Further, the distance a1 from the optical axis Ax of the objective lens 20 to the pinhole 12a is about 60 mm, the distance b1 from the pinhole 12a to the surface 1a of the silicon wafer OR is about 300 mm and the distance c1 from the objective lens 20 to the surface 1a is about 50 mm. Assuming that the length of the pattern is 2 cm, the image of the pattern is about 1.96 mm long on the imaging element 33. Thus, the imaging element 33 may be, for example, ½ inch in length.

Figure 5:
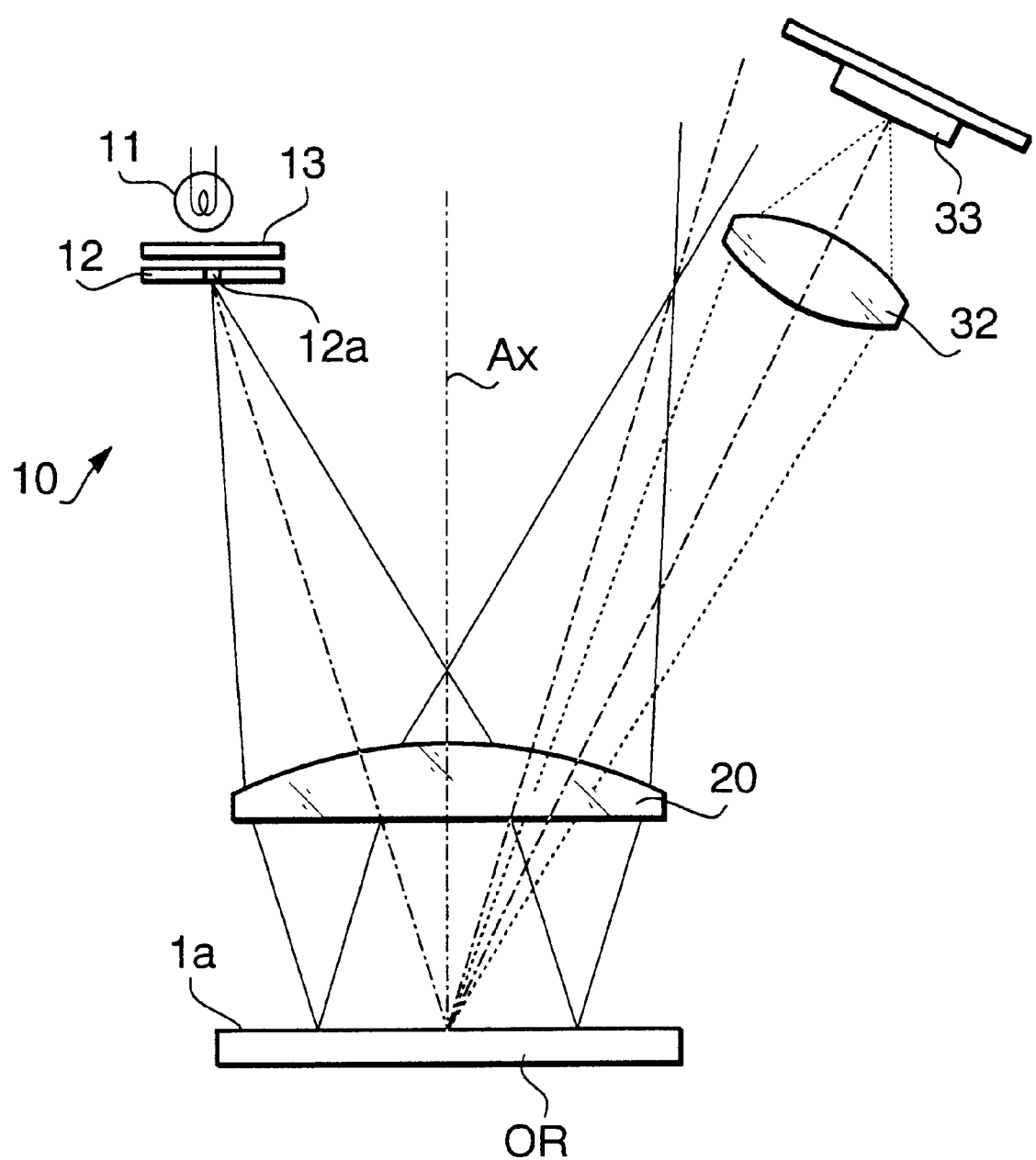
FIG. 5 shows a first modification of the first embodiment.
Figure 6:
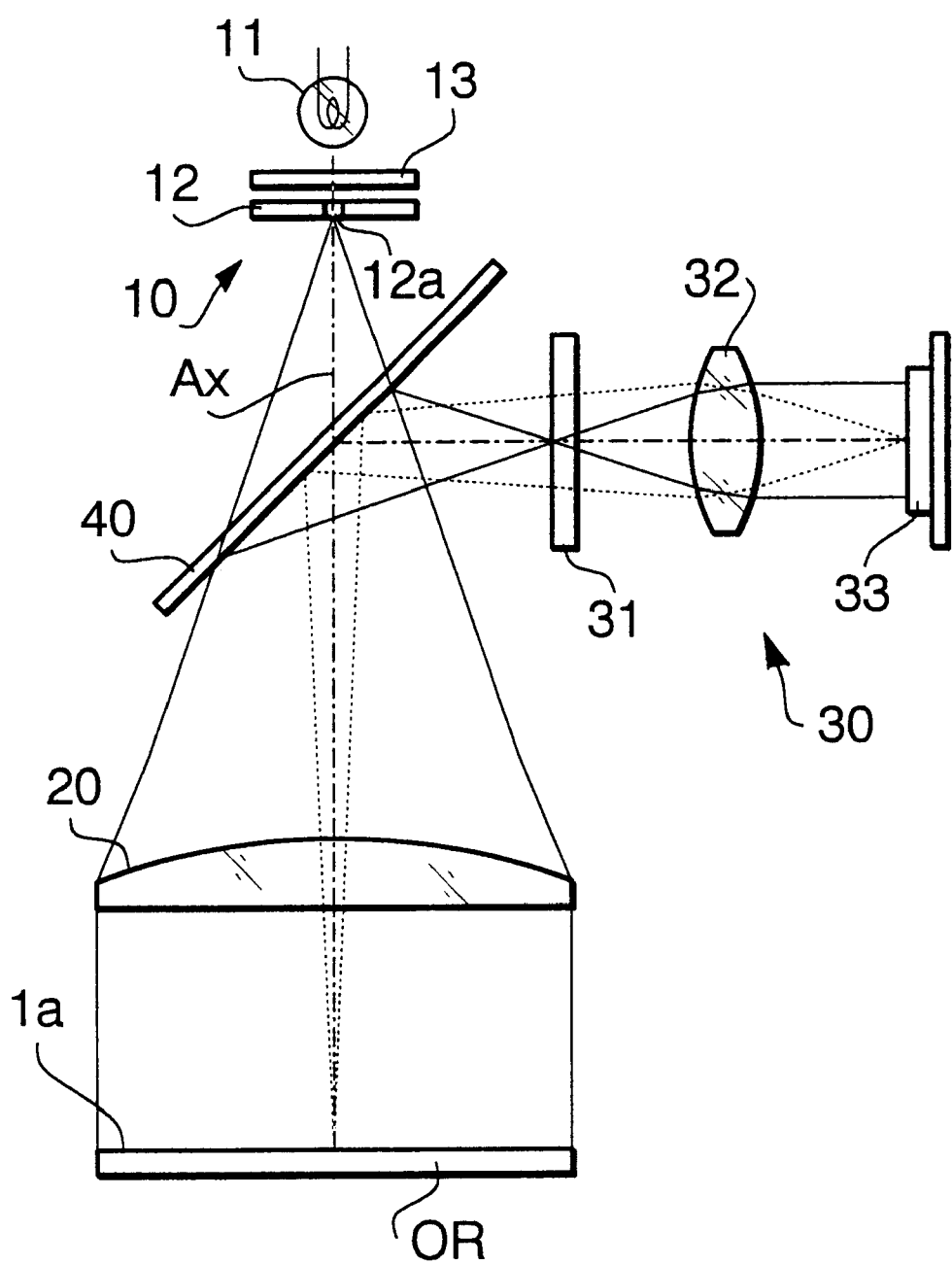
FIG. 6 shows a second modification of the first embodiment.
Figure 7:
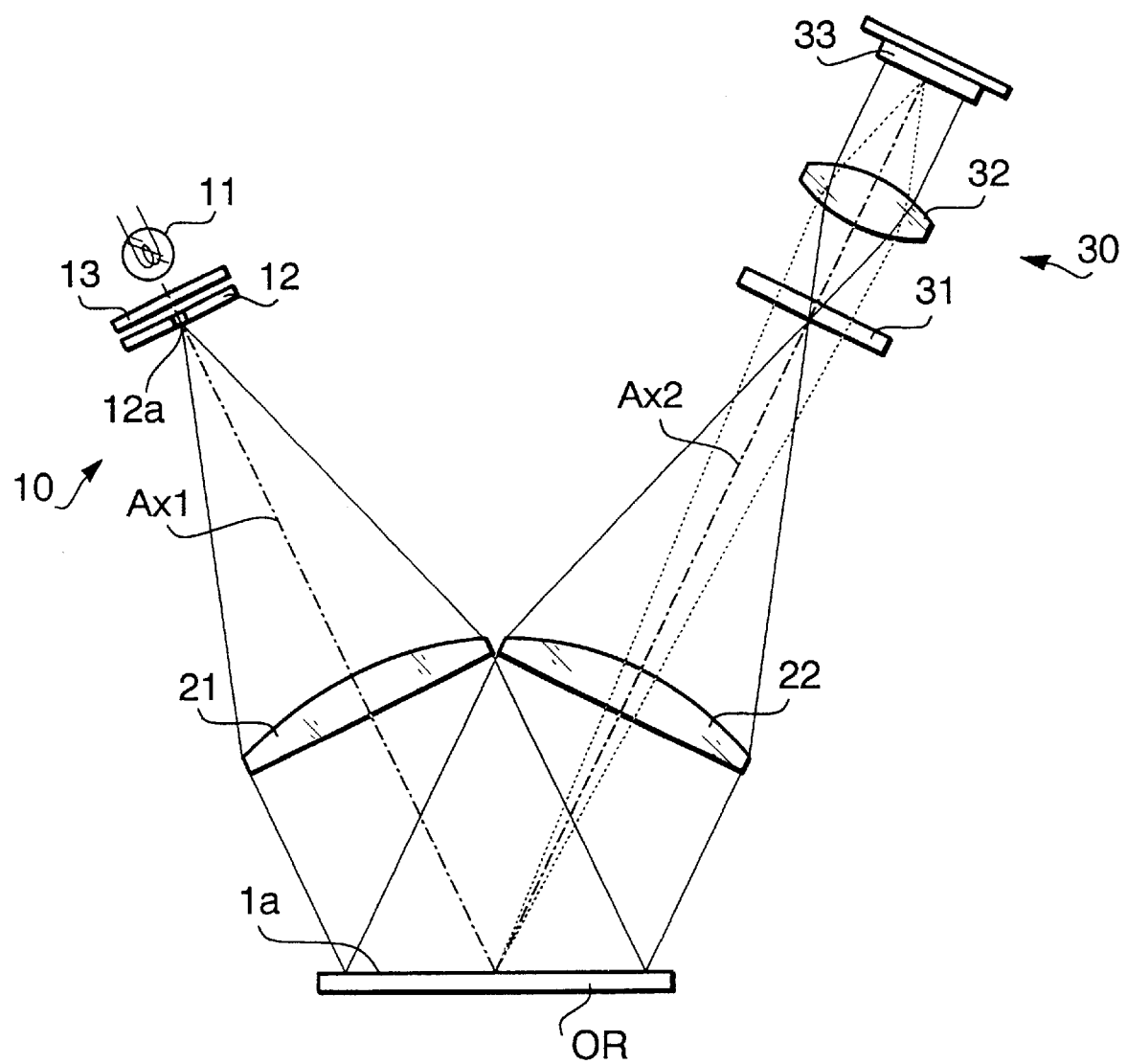
FIG. 7 shows a third modification of the first embodiment.

FIGS. 5 to 7 show modifications of the optical system according to the first embodiment. In the modifications, the illumination unit 10, the imaging lens 32, and the imaging element 33 of the detection unit 30 are the same as those of the first embodiment shown in FIG. 1.

In a first modification shown in FIG. 5, the imaging lens 32 is disposed in a position at which the specularly reflected component will not be incident thereon. In this way, the spatial filter 31 is not required. More particularly, in the example of FIG. 5, the imaging lens 32 is disposed at a position which is farther from the optical axis Ax of the objective lens 20 than in FIG. 1. Accordingly, only the diffusely reflected component is incident on the imaging lens 32, and an image of the pattern, in which the edge portion is emphasized, is formed on the imaging element 33 without the spatial filter 31.

In a second modification, shown in FIG. 6, the illumination unit 10 is disposed on the optical axis Ax of the objective lens 20 such that an illumination light beam is incident on the surface 1a of the silicon wafer OR at a right angle (i.e., along the optical axis Ax). In this modification, a beam splitter 40 is disposed in the optical path between the pinhole plate 12 and the objective lens 20 to separate the optical path of the illumination light beam emitted from the illumination unit 10 from the optical path of the reflected light beam from the surface 1a.

The illumination light beam from the pinhole 12a passes through the beam splitter 40 and the objective lens 20 to become a parallel light beam (also parallel with the optical axis Ax) that illuminates the surface 1a. The reflected light beam from the surface 1a passes through the objective lens 20 again and becomes a converging light beam, a part of which is reflected at the beam splitter 40 toward the spatial filter 31. A position of the spatial filter 31 is conjugate with the minute-area light source, similar to the first embodiment, and shades the specularly reflected component of the reflected light beam. The diffusely reflected component passes through the spatial filter 31 and the imaging lens 32 to form an image of the pattern on the imaging element 33.

In a third modification, shown in FIG. 7, an objective lens is composed of an illumination lens (a first lens) 21 through which an illumination light beam passes and an objective lens (a second lens) 22 through which the reflected light beam from the surface 1a of the silicon wafer OR passes. These lenses 21, 22 are disposed such that the optical axes Ax1, Ax2 thereof cross each other at the surface 1a of the silicon wafer OR. The other arrangement and operation of the third modification are the same as those of the first embodiment. It should be noted that in the third modification, the minute-area light source is located at a focal point of the first lens 21, and the filter 31 is located at a focal point of the second lens 22.

Figure 8:
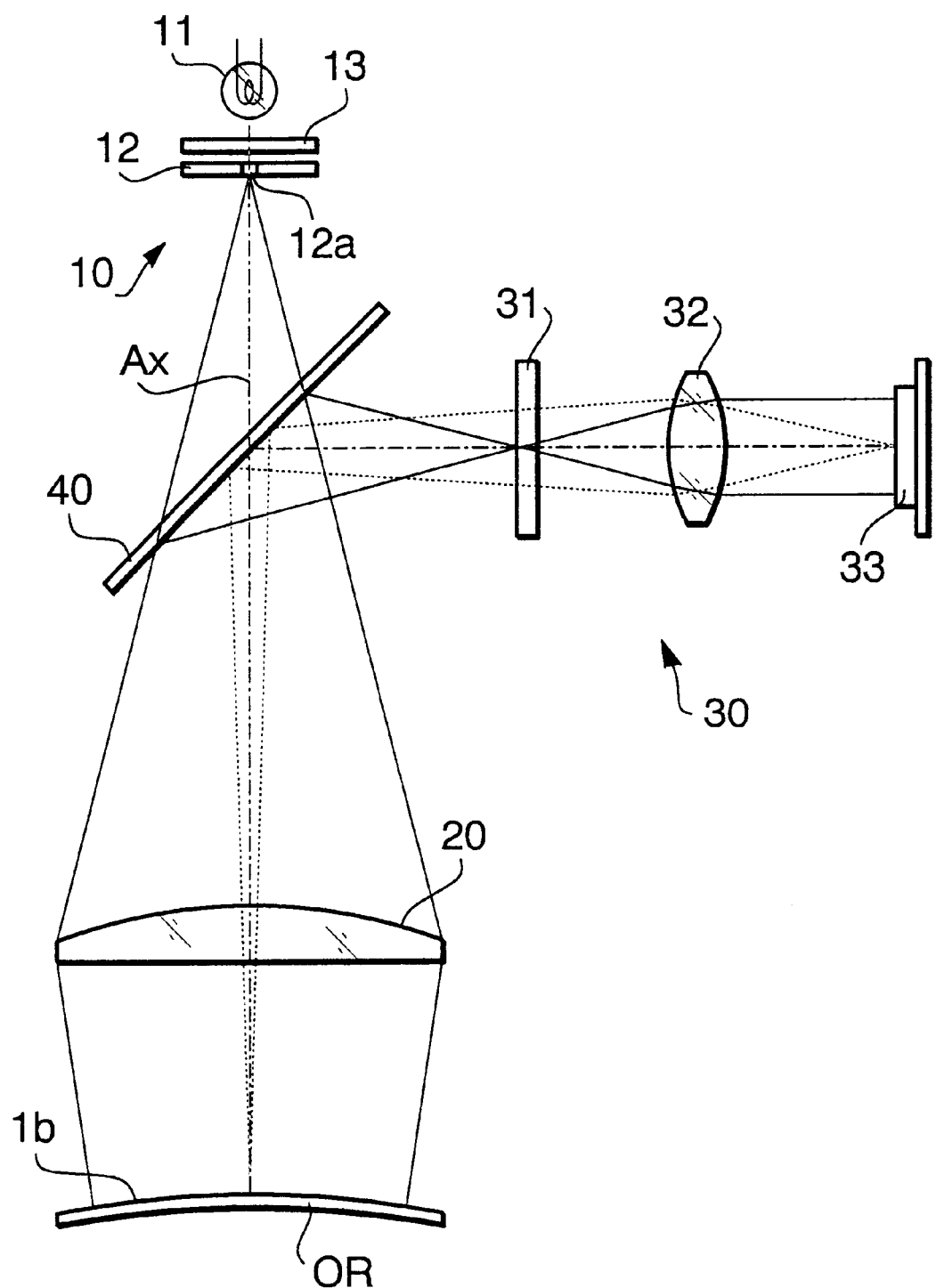
FIG. 8 shows a fourth modification of the first embodiment.
Figure 9:
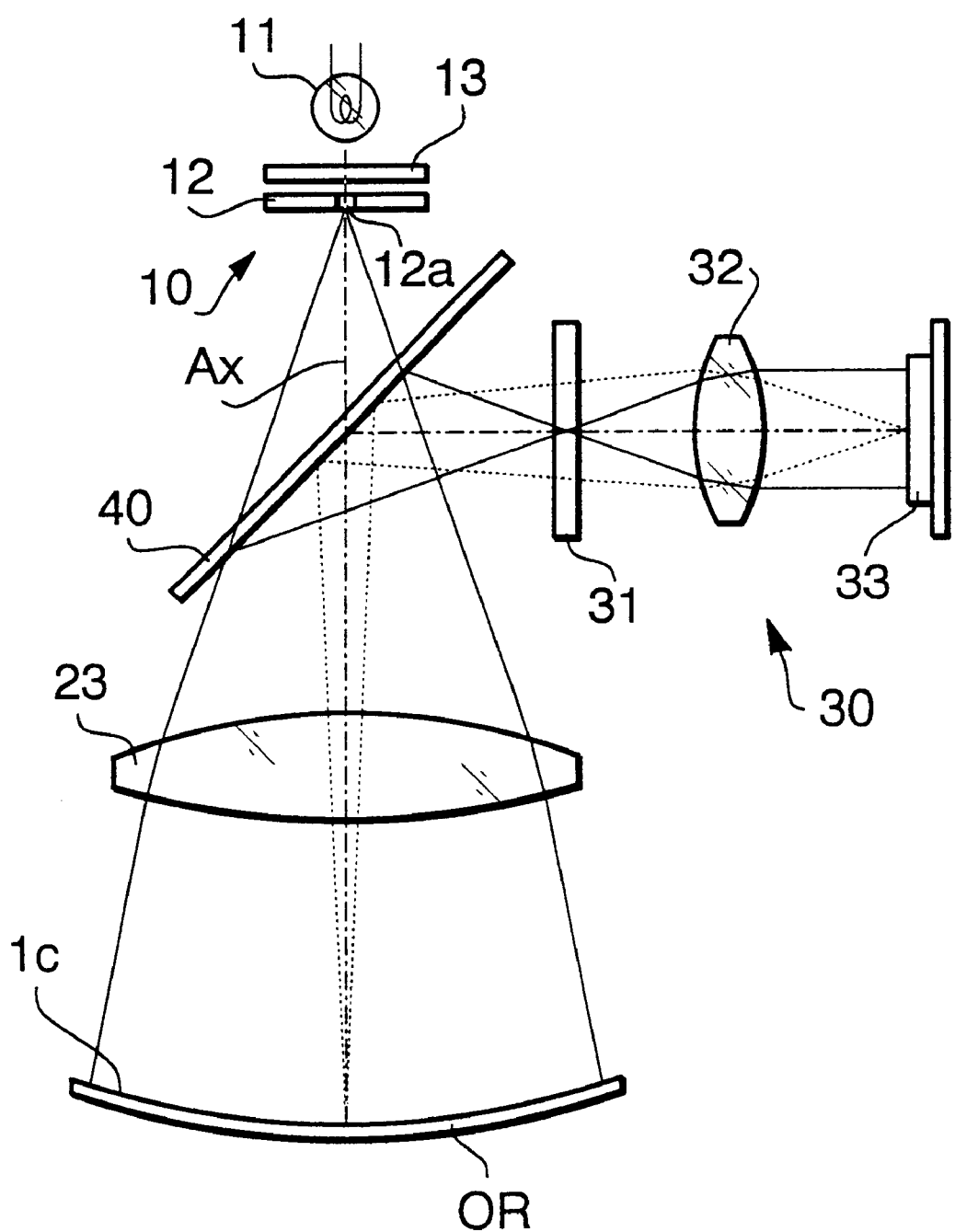
FIG. 9 shows a fifth modification of the first embodiment.

FIGS. 8 and 9 show further modifications of the first embodiment. These modifications have substantially the same structure as that of the second modification of FIG. 6. The modification shown in FIG. 8 is used when an object to be read has a convex spherical surface 1b and the modification shown in FIG. 9 is used when an object to be read has a concave spherical surface 1c.

In FIG. 8, an objective lens 20 makes a minute-area light source provided by a pinhole 12a conjugate with the center of curvature of the object surface 1b and causes an illumination light beam to be incident on the object surface 1b as a converging light beam that is substantially perpendicular to the object surface 1b. The illumination light beam is diffusely reflected at edges of the impressed pattern and specularly reflected at portions other than the edges. These reflected components then become incident on the objective lens 20 again. In particular, the specularly reflected component passes through the objective lens 20 along the same optical path as the illumination light beam.

In FIG. 9, an objective lens 23 makes a minute-area light source provided by a pinhole 12a conjugate with the center of curvature of the object surface 1c and causes an illumination light beam to be incident on the object surface 1c as a diverging light beam that is substantially perpendicular to the object surface 1c. The illumination light beam is diffusely reflected at edges of the impressed pattern and specularly reflected at portions other than the edges. The reflected components are then incident on the objective lens 23 again. In particular, the specularly reflected component passes through the objective lens 20 along the same optical path as the illumination light beam.

Note, the minute-area light source may also be a light emitting diode rather than the combination of the halogen lamp 11 and the pinhole plate 12 used in the above and following embodiments and modifications. Because the light emitted by the light emitting diode is concentrated at a central portion, the light emitting diode may be suitably used as a minute-area light source that is near to a point light source. Alternatively, a combination of a lamp and an optical fiber may also be used to realize the minute-area light source. That is, the lamp and an incident end of the optical fiber may be located at a separated position, and the other end of the optical fiber can be used as the minute-area light source.

As described above, according to the first embodiment, because an image is formed using only the diffusely reflected component of the reflected light beam from an object (i.e., the specularly reflected component is prevented from reaching the imaging device), a pattern, such as a serial number, or the like, formed on a reflective surface, such as a silicon wafer, can be easily read. Therefore, the pattern can be easily and accurately recognized by displaying the pattern or using character recognition techniques to decode the pattern. In particular, even if a pattern has deteriorated through processes such as etching, vapor deposition, and the like, it can be easily read.

Second Embodiment

FIGS. 10(A), (B) and (C) show optical systems for a pattern reading apparatus according to a second embodiment and modifications thereof. The second embodiment is an example of a filtering optical system for detecting a pattern contained in a light-transmission-type object OT. A light beam emitted from a lamp (not shown) passes through a pinhole plate 12 to form a minute-area light source, and the light emitted from the minute-area light source is incident on the object OT through an illumination lens (first lens) 21. The light beam then passes through an objective lens (second lens) 22, a spatial filter 31, and an imaging lens 32, to form an image of the object OT on an imaging surface 33a.

The spatial filter 31 has a shading region at a center thereof for shading the portion of the light beam from the minute-area light source which has not been scattered by the object OT. In the second embodiment, the spatial filter 31 is disposed nearer to the objective lens 22 than a paraxial image point IM of the minute-area light source. The spatial filter 31 is similar to ones shown in FIG. 2 or FIG. 3.

In FIG. 10(A), the objective lens 22 is a Fourier transformation lens. In this case, the minute-area light source is located at the front focal point of the illumination lens 21 such that the object OT is illuminated by a parallel light beam. In addition, the object OT is located at the front focal point of the objective lens 22 (the Fourier transformation lens). The back focal point of the objective lens 22 coincides with the front focal point of the imaging lens 32, and the imaging surface 33a is located at the focal point of the imaging lens 32.

In the first embodiment, the spatial filter 31 is located at the conjugate position of the minute-light source with respect to the objective lens 20. In other words, in the first embodiment, the spatial filter 31 is located at the paraxial image point IM of the minute-area light source, that is, at the back focal point of the objective lens 20. However, if the objective lens includes aberrations such as spherical aberration, coma, or curvature of field, the spread of the image of the minute-area light source is not reduced to a minimum at exactly the paraxial image point IM.

Thus, in the second embodiment, the spatial filter 31 is disposed at a position where the image of the minute-area light source is a minimum size after taking the effect caused by the spherical aberration of the objective lens 22 and the effect resulting from the coma and curvature of field caused by abaxial rays into consideration. With this arrangement, the shading region may be made smaller than a region which is located at the paraxial image point IM.

Specifically, the spatial filter 31 is disposed at the position which satisfies the condition that the distance L from the final surface of the objective lens 22 to the spatial filter 31 is 0.60 fo<L<0.95 of, wherein of is the focal length fo of the objective lens 22. Because the size of the image of the light source at a point within the range of 0.60 fo<L<0.95 of is smaller than the size at the paraxial image point IM (L=fo), the shading region can be made smaller than that of the first embodiment. Note, when the above arrangement is applied to an actual optical system, it is preferable to determine a position where the size of the image of the minute-area light source is minimized by tracing light rays. The spatial filter 31 is then placed at an appropriate position in accordance with the shape of the image.

FIG. 10(B) shows a modification of the optical system in FIG. 10(A) arranged to permit an adjustment of magnification. In the arrangement shown in FIG. 10(A), since the light beam emitted from a point on the object OT becomes a parallel light beam after passing through the objective lens 22, as shown by a dotted line, magnification cannot be changed by moving the imaging lens 32. In order to allow magnification to be changed by moving the imaging lens 32, the optical system in FIG. 10(B) is arranged such that a distance X from the object OT to an objective lens 22 is set shorter than the focal length of the objective lens 22. With this arrangement, a light beam from a point on the object OT passes through the objective lens 22 to be a non-parallel light beam, and accordingly the magnification can be changed by moving an imaging lens 32 and an imaging surface 33a.

In particular, it is preferable that the distance X satisfies the condition 0<X<0.7 fo where the focal length of the objective lens is fo. In this arrangement, because the paraxial image point IM where the image of the light source is formed will also be closer to the object OT, the spatial filter 31 can also be located nearer to the object OT as compared with the optical system of FIG. 10(A). With this arrangement, the movable range of the imaging lens 32 is larger, providing a wider variable magnification range.

As a further modification, in FIG. 10(C), the position of a minute-area light source is located farther from an illumination lens 21 than the front focal point of the illumination lens 21. With this arrangement, since the illumination light beam emitted from the illumination lens 21 is a converging light beam, the position of the image of the minute-area light source formed through an objective lens 22 is formed nearer to the object OT, so that the movable range of the imaging lens 32 can be further increased allowing an even wider variable magnification range.

According to the second embodiment and its modifications, since the spatial filter 31 is disposed at the position where the size of the image of the minute-area light source formed by the objective lens is smallest, the area of the shading region of the spatial filter may be made as small as possible, such that a bright image of the emphasized image of the pattern can be formed. Further, the magnification of the image formed on the imaging device can be made variable.

Third Embodiment

FIGS. 11(A) and 11(B) show optical systems of the pattern reading apparatus according to a third embodiment. The third embodiment is an example of a filtering optical system for detecting a pattern contained in a reflection type object to be detected similar to the first embodiment.

In FIG. 11(A), a light beam from a lamp (not shown) is incident on a pinhole plate 12 to form a minute-area light source. Light from the minute-area light source passes through an objective lens 20 and is obliquely incident on a reflection type object OR. The light beam reflected at the object OR is converged through the objective lens 20, passes through an imaging lens 32, and forms a pattern image of the object OR on an imaging surface 33a. In this embodiment, the objective lens 20 is rotatable about a rotation axis Rx that is perpendicular to a plane of incidence and intersects the optical axis Ax of the objective lens 20.

A portion of the illumination light beam which is incident on the objective lens 20 from the pinhole plate 12 is reflected by the objective lens 20 and may be incident on the imaging lens 32 as a ghosting light. If the ghosting light overlaps the pattern image, the contrast of the image is reduced and accordingly it may be difficult to read the pattern image. Thus, in this embodiment, the direction in which the ghosting light is reflected is changed by turning the objective lens 20. In particular, because the direction of the ghosting light is very sensitive to the rotation of the objective lens 20, but the direction of the transmitted light beam is less sensitive to the rotation of the objective lens 20, it is possible to change a position of the ghosting light without substantially changing the position of the pattern image. In this embodiment, the spatial filter is not used. By reducing the ghosting light, the contrast of the pattern image can be improved to make it easier for a user to recognize the pattern image.

FIG. 11(B) shows a modification of the third embodiment, arranged such that a light beam from a pinhole plate 12 passes through the objective lens 20 and is perpendicularly incident on the object OR. A portion of the reflected light beam from the object OR passes through the objective lens 20, is reflected at a beam splitter 40, and is incident on the imaging lens 32. As in the arrangement of FIG. 11(A), the objective lens 20 is rotatable about the rotation axis Rx that is perpendicular to a plane of incidence and intersects the optical axis Ax of the objective lens 20. As a result, it is possible to adjust a position of ghosting light so that the ghosting light does not overlap the pattern image on the imaging surface 33a.

The optical system of the third embodiment may also include a spatial filter similar to that of the first and second embodiments.

In this case, the effect of turning the objective lens can be used to control the position of the image of the minute-area light source formed on the spatial filter in addition to controlling the direction of the ghosting light.

According to the third embodiment, when the reflection on the surface of the objective lens prevents observation, and when the reflection surface of a reflection type object is tilted, a desired filtered output image can be obtained. The filtered output image can be obtained by changing the position where an image is formed by turning the objective lens a predetermined angle about the turning axis of the objective lens. The turning axis is perpendicular to the optical axis thereof.

Fourth Embodiment

FIGS. 12(A) and 12(B) show an optical system included in a pattern reading apparatus according to a fourth embodiment. This is an example of a filtering optical system for detecting a pattern contained in a light-transmission-type object, similar to the second embodiment.

A light beam emitted from a lamp (not shown) passes through a pinhole plate 12 to form a minute-area light source. The light emitted from the minute-area light source passes through an illumination lens 21, and is incident on a light-transmission-type object OT. The light beam passes through the object OT, through an objective lens 22, through a spatial filter 31, and forms an emphasized image of the object OT on an imaging surface 33a. The spatial filter 31 has a shading region at the center thereof for shading the light beam which forms the image of the light source. In this embodiment, as in the second embodiment, the spatial filter 31 is disposed nearer to the objective lens 22 than the paraxial image point IM of the light source. As in the third embodiment, the objective lens 22 is rotatable about a rotation axis Rx that is perpendicular to the optical axis thereof as shown in FIG. 12(A).

FIG. 12(A) shows a case in which the surface of the object OT is not homogeneous. In this case, the shape of the image of the minute-area light source may be deformed and may not conform with the shape of the pinhole. Thus, there is a possibility that the image of the minute-area light source will not coincide with the shading region of the spatial filter 31. By rotating the objective lens 22, the shape of the image of the minute-area light source is changed due to a change of coma and the objective lens 22 may be rotated until the image of the minute-area light source coincides with the shading region.

FIG. 12(B) shows a case in which the object OT is shaped and functions as a prism. In this case, the light beam forming the image of the minute-area light source is directed slightly upward from the optical axis, and may not be shaded by the shading region of the spatial filter 31. To cope with this problem, the objective lens 22 is rotated a predetermined acute angle counterclockwise (as shown in FIG. 12(B)) about the rotation axis Rx. The rotation of the objective lens 22 adjusts the position of the image of the minute-area light source, so that the light beam which forms the image of the light source is appropriately shaded by the spatial filter 31.

Fifth Embodiment

FIGS. 13(A), 13(B), and 13(C) show an optical system for a pattern reading apparatus according to a fifth embodiment. This is an example of a filtering optical system for detecting a pattern contained in a light-transmission-type object, similar to the second embodiment.

A light beam emitted from a lamp (not shown) passes through a pinhole plate 12 to form a minute-area light source. The light then passes through an illumination lens 21, and is incident on a light-transmission-type object OT. The light beam passes through the object OT, through an objective lens 22, through a spatial filter 31, and forms an emphasized image of the object OT on an imaging surface 33a. The spatial filter 31 has a shading region at the center thereof for shading the portion of the light beam which forms the image of the minute-area light source. In this embodiment, the spatial filter 31 is disposed nearer to the objective lens 22 than the paraxial imaging point IM of the minute-area light source. In the fifth embodiment, the lamp (not shown) and the pinhole plate 12 are movable in a plane perpendicular to an optical axis as shown by an arrow A in FIG. 13(A). Further, the spatial filter 31 is also movable in a plane perpendicular to the optical axis as shown by an arrow B in FIG. 13(A).

In the optical system shown in FIG. 13(A), the pinhole plate 12 is located at the front focal point of the illumination lens 21 and the object OT is located at the front focal point of the objective lens 22 (the Fourier transformation lens). The back focal point of the objective lens 22 coincides with the front focal point of the imaging lens 32 and the imaging surface 33a is located at the focal point of the imaging lens 32.

FIGS. 13(B) and 13(C) show a case in which the object OT has a prism shape. In this case, since the light beam from the object OT is refracted upward (in the view of FIGS. 13(A), 13(B), and 13(C)), the portion of the light beam that forms the image of the minute-area light source may not be shaded by the shading region of the spatial filter 31. In this case, as shown in FIG. 13(B), the light source and the pinhole plate 12 may be moved a predetermined amount upward to adjust the position of the image of the minute-area light source such that the portion of the light beam which forms the image of the minute-area light source is shaded by the spatial filter 31. In FIG. 13(B), a solid line indicates the case that a pinhole is located on the optical axis and a dot-dash-line indicates the case that the pinhole plate is moved upward. Alternatively, as shown in FIG. 13(C), the spatial filter 31 may be moved a predetermined amount upward (in the view of FIG. 13(C)) in a plane perpendicular to the optical axis in order to ensure that the position of the image of the minute-area light source coincides with the shading region of the spatial filter 31.

According to the fifth embodiment, even if an object functions as a prism, the image of the light source can be caused to coincide with the shading region of the spatial filter by adjusting the position of the light source or the position of the spatial filter. The above-described principle can be applied to a system using the reflection type object.

Sixth Embodiment

FIGS. 14 to 23 show a pattern reading apparatus according to a sixth embodiment. The apparatus of the sixth embodiment is for a reflection type object and provides all the features described in the second to the fifth embodiments, that is:

(1) the spatial filter 31 is placed nearer to the objective lens 20 than the paraxial image point IM;
(2) the magnification is adjustable;
(3) the objective lens 20 is rotatable about the axis Rx which is perpendicular to a plane of incidence; and
(4) the lamp 11 and the pinhole plate 12 and/or the spatial filter 31 are movable in a direction perpendicular to the optical axis of the objective lens 20.

As shown in a schematic view in FIG. 14, the optical system of the apparatus includes an illumination unit 10, an objective lens 20, and a detection unit 30. The objective lens 20 is disposed such that the optical axis Ax thereof is perpendicular to the surface 1a of a silicon wafer OR (i.e., a reflection surface) in a standard position. The illumination unit 10 and the detection unit 30 are disposed approximately symmetrically on opposite sides of the optical axis Ax of the objective lens 20 in the standard position.

The illumination unit 10 includes a lamp 11, a pinhole plate 12 formed with a pinhole 12a to form a minute-area light source, and a diffusion plate 13 provided between the lamp 11 and the pinhole plate 12. The detection unit 30 includes a spatial filter 31, an imaging lens 32, and an imaging element 33. In the example of FIG. 14, the detection unit 30 is disposed on a line which extends in a direction in which a specularly reflected component of light from the minute-area light source is reflected from the surface 1a.

The light beam emitted from the lamp 11 passes through the pinhole 12a, through the objective lens 20, and is incident on the surface 1a. The light beam is reflected at the surface 1a, passes through the objective lens 20 again, and is incident on the spatial filter 31. In this embodiment, the pinhole 12a (the minute-area light source) is positioned at a front focal position of the objective lens 20 (i.e., a position on a plane which is perpendicular to the optical axis Ax of the objective lens 20, and which includes a front focal point of the objective lens 20) such that the light beam emitted from the objective lens 20 is a parallel light beam and obliquely illuminates the surface 1a of the silicon wafer OR. The illumination light beam is diffusely reflected at an impressed pattern portion of the surface 1a and specularly reflected at portions other than the above.

The light beam reflected at the surface 1a passes through the objective lens 20 again, is transformed into a converging light beam directed toward the detection unit 30 and reaches the spatial filter 31. The spatial filter 31 is disposed nearer to the objective lens 20 than the paraxial image position of the minute-area light source.

The diffusely reflected component, which has passed through the spatial filter 31, of the light beam reflected at the surface 1a is incident on the imaging lens 32. The imaging lens 32 forms the emphasized image of the pattern impressed on the surface 1a on the imaging element 33 by the diffusely reflected component. The imaging element 33 converts the information of the emphasized image of the pattern into an electric signal and outputs the signal to an image processing apparatus (not shown).

The objective lens 20 is rotatable about a rotation axis Rx, as shown by the arrow R in FIG. 14. In this embodiment, the rotation axis Rx is parallel with a line where a plane, which is perpendicular to the principal beam Ax1 of the illumination light beam, crosses a plane which is perpendicular the optical axis Ax2 of the imaging lens 32 (i.e., the rotation axis Rx is perpendicular to a plane of incidence and crosses the optical axis Ax). The objective lens 20 is rotatable with a range of about ±45 degrees from the standard position.

If a ghosting light, i.e., a reflection at the surface of the objective lens 20, is incident on the imaging lens 32 and overlaps the position of the pattern image on the imaging element 33, the objective lens 20 is rotated so that the ghosting light does not overlap the pattern image.

When the distribution of the diffusely reflected light beam is uneven on the surface 1a, there is a possibility that the shape of the image of the light source is changed and displaced from the shading region 31b of the spatial filter 31. In such a case, the shape of the image of the light source can be changed by controlling coma by turning the objective lens 20.

Further, the illumination unit 10 is adjustable in a direction, shown by the arrow S1, in a plane perpendicular to the optical axis Ax in order to adjust the position of the image of the minute-area light source with respect to the shading region 31b of the spatial filter 31. Still further, the spatial filter 31 is adjustable in a direction, shown by the arrow S2, in a plane that is perpendicular to the optical axis Ax2 of the imaging lens 32.

In this way, if the surface 1a is tilted, the position where the image of the light source is formed can be adjusted to coincide with the shading region 31b by adjusting the position of the illumination unit 10 and/or the spatial filter 31.

Still further, the imaging lens 32 and the imaging element 33 are arranged such that they are movable along the optical axis Ax2 of the imaging lens 32, shown by the arrow S3, to change magnification. In addition, to permit the magnification to be changed by the movement of the imaging lens 32, the distance between the objective lens 20 and the surface 1a (object surface) is set to satisfy the condition 0<X<0.7 fo, where fo is the focal length of the objective lens 20. When this condition is satisfied, since a light beam emitted from a point on the surface 1a is not parallel after passing through the objective lens 20, the magnification can be changed by moving the imaging lens 32 along the optical axis Ax2.

FIG. 15 shows an expanded optical path of the optical system of FIG. 14. The light beam emitted from the pinhole plate 12, is collimated to be a parallel light beam by the objective lens 20, reflected at the surface 1a (passes therethrough in FIG. 15), is incident on the objective lens 20 again, passes through the spatial filter 31 as a converging light beam, passes through the imaging lens 32, and forms an image of the pattern on the imaging element 33. The optical system in FIG. 14 is fundamentally equivalent to the optical system of the second embodiment shown in FIG. 10(B) except with respect to the incident direction of the light beam and the transmission/reflection characteristics of the object. That is, in the example in FIG. 14, the surface 1a is nearer to the objective lens 20 than the focal point thereof and a light beam from a point on the surface 1a is incident on the imaging lens 32 not as a parallel light beam but as divergent light.

FIG. 16 shows a design example when it is assumed that the length of a pattern to be read is 2 cm and the size of the imaging surface of an imaging element is ½ inch across a diagonal. In this example, the imaging lens 32 has a focal length of 50 mm and the objective lens 20 has a focal length of of 220 mm. Further, a distance b from the pinhole 12a to the surface 1a of the silicon wafer OR is about 270 mm, a distance c from the objective lens 20 to the surface 1a is about 50 mm, and a distance L from a final surface of the objective lens 20 to the spatial filter 31 is about 190 mm. Therefore, the condition 0.60 fo<L<0.95 fo, described above, is approximately 130 mm<L<210 mm in this example. Further, the condition 0<X<0.7 fo, also described above, is 0<X<154 mm.

FIGS. 17(A) through 17(H) are spot diagrams showing the shape of the image of a minute-area light source calculated based on the model shown in FIG. 16, that is, the distribution of the light beam from the surface 1a which constitutes the specularly reflected component, at various distances DF from the paraxial image point of the minute-area light source. The distance DF is 0 at the paraxial image point and a minus sign represents a position closer to the objective lens 20. In the example, since the size of the image of the minute-area light source is minimized about 30 mm or 40 mm closer to the objective lens from the paraxial image point, the disposition of the spatial filter in this range permits the specularly reflected component to be shaded by a small shading region so that a maximum possible quantity of light can be used to form a bright image of the pattern.

Next, a specific mechanical arrangement of an apparatus including the optical system shown in FIG. 14 is described with reference to FIGS. 18 and 19. Note, as shown in FIG. 18, a coordinate system x, y, z is defined in which the x-axis is parallel with the optical axis Ax of the objective lens 20 at the standard position. Further, the principal beam Ax1 of an illumination light beam and the optical axis Ax2 of an imaging lens are contained in an x-z plane.

The pattern reading apparatus of the sixth embodiment includes a base frame 100 on which a silicon wafer (i.e., an object to be inspected) is placed at a reference position T, shown by a dot-dash-line, and a movable frame 200 which is disposed on the base frame 100, is supported by bearings 101 so as to slide in the direction y with respect to the base frame 100.

The movable frame 200 is moved by a frame drive mechanism 210 (shown in FIG. 19). As shown in FIG. 19, the frame drive mechanism 210 includes a ball screw 211 which is disposed to a screw support portion 102, secured to the base frame 100 in such a manner that the rotation of the ball screw 211 can be adjusted, and a threading member 212 which is secured to the horizontal support plate 201 (parallel with a y-z plane) of the movable frame 200. The ball screw 211 includes an operation knob 211a on an outer side thereof for operation by an inspector and a screw portion 211b formed on an inner side, i.e., a portion projecting toward the movable frame 200. The screw portion 211b of the ball screw 211 is screwed into a screw hole provided in the threading member 212. Thus, when the ball screw 211 is rotated, the movable frame 200 slides in the direction y.

The movable frame 200 is provided with a horizontal support plate 201 and a tilt mechanism 220 is disposed to the horizontal support plate 201 for rotatably supporting the objective lens 20. A column 202 extends perpendicularly from the horizontal support plate 201 and a vertical support plate 203 (parallel with the x-z plane) is secured to the column 202. The vertical support plate 203 supports an optical fiber 11d and a pinhole plate 12 which constitute a minute-area light source and an imaging unit 320. The imaging unit 320 includes a lens barrel 32A housing the imaging lens 32 and a CCD unit 33A housing the imaging element 33. Optical path holes 100a, 201a, 221a are formed in the horizontal support plate 201, the base frame 100, and the base plate 221, respectively, such that the light beam from the lamp 11 may pass through to the silicon wafer to allow the reflected light beam from the silicon wafer to pass to the imaging unit 320.

The tilt mechanism 220 includes the column 202, the base plate 221, and a bearing unit 222 (see FIG. 19). The base plate 221 is disposed between the column 202 and the support member 204 (see FIG. 18). The support member 204 extends from the horizontal support plate 201 in parallel with the column 202. The bearing unit 222 extends below the base plate 221. The objective lens 20 is accommodated in a lens frame 223 having a rotation shaft 223a extending in the direction y. The lens frame 223 is rotatably mounted to the bearing unit 222 through the turning shaft 223a. Opposite ends of the turning shaft of the lens frame 223 project from the bearing unit 222. A follower pulley 224 is secured to the end of the turning shaft projecting toward the frame drive mechanism 210 and a rotary plate 225 of an encoder is secured to the other end thereof.

A lens drive motor 226 is mounted on the base plate 221 of the tilt mechanism 220 and a timing belt 227 is stretched between a drive pulley 226a secured to the rotary shaft of the motor 226 and the follower pulley 224. The encoder is composed of the rotary plate 225 mounted on a rotary shaft and a photo interrupter 228 composed of a light emitting element (not shown) and a light receiving element (not shown) disposed across the rotary plate 225. The rotary plate 225 has a slit (not shown) formed radially thereon and is adjusted such that when the objective lens 20 is set at the standard position, a light beam emitted from the light emitting element of the photointerrupter 228 is detected by the light receiving element through the slit. As described above, the standard position of the objective lens 20 in this example is a position where the optical axis Ax of the objective lens 20 is set perpendicular to an ideal object surface (a flat surface).

The lamp 11 is composed of a halogen lamp 11a, an infrared-ray cut filter 11b for reducing a heating component of the converging light beam emitted from the halogen lamp 11a, a negative lens 11c for making the converging light beam an approximately parallel light beam, and an optical fiber 11d. A pinhole unit 120 includes the pinhole plate 12, a mounting plate portion 122 formed perpendicularly to the pinhole plate 12, and a holding unit 121 for holding the exit end of the optical fiber 11d. The pinhole unit 120 is mounted on the vertical support plate 203 by bolts 123, 123 through the mounting plate portion 122. Securing grooves 124, 124 formed in the mounting plate portion 122 extend in a plane which is perpendicular to the axis Ax1 of the illumination light beam, so that, by loosening the bolts 123, the unit 120 is easily movable in a direction perpendicular to the axis Ax1, i.e., closer to the imaging unit 320 or away from the imaging unit 320.

In this example, the optical fiber 11d is a commercially available optical fiber having a diameter of about 5 mm. Thus, a pinhole 12a is used reduce the light beam from the optical fiber 11d to a minute-area light source, however, if the optical fiber 11d has a diameter of 1 mm to 2 mm, the pinhole 12a is not necessary. Further, if the density of the light beam emitted from the end surface of the optical fiber 11d is uneven, it is preferable to provide a diffusion plate (not shown) between the end surface of the fiber 11d and the pinhole 12a.

The spatial filter 31 is secured to a filter holder 130 which is then secured to the vertical support plate 203. The spatial filter 31 includes a shading region at the center thereof, similar to that shown in FIG. 3. The spatial filter 31 is arranged at a position which is nearer to the objective lens 20 than the paraxial image point such that the size of the image of the light source formed by the objective lens 20 is minimized.

The imaging unit 320 is also mounted on the vertical support plate 203. The vertical support plate 203 is formed with a slot 205 in a direction parallel to the optical axis Ax2 of the imaging lens 32. The slot 205 includes a first wide step portion 205a formed on the imaging unit 320 side to a depth approximately half a plate thickness and a second narrow step portion 205b formed at the center in the width direction of the first step portion 205a passing through the vertical support plate 203 from the first step portion 205a. The imaging unit 320 includes two mounting arms 322 formed thereto that are each inserted through a washer 323 provided in the first step portion 205a of the slot 205 and then secured by bolts 321 screwed into the ends of each of the arms 322 from the opposite side of the vertical support plate 203. The washers 323 have a diameter smaller than the first step portion 205a and larger than the second step portion 205b. With the above arrangement, the imaging unit 320 is movable in the direction of the optical axis Ax2 of the imaging lens 32. Further, the imaging lens 32 can also be adjusted in the optical axis direction by a lens barrel adjustment mechanism (not shown). Thus, in the embodiment, the magnification can be changed by one or both of the above two adjustments.

In the apparatus of the sixth embodiment, since the position T is determined so that the silicon wafer is located closer to the objective lens 20 than the focal point thereof, the reflected light beam from a point on the surface of the silicon wafer is incident on the imaging lens 32 as a divergent light beam. As a result, according to the arrangement of the sixth embodiment, the magnification can be changed by moving the imaging lens 32 in the optical axis direction. However, when the imaging lens 32 is moved to change the magnification, the focusing state of the pattern to the imaging element 33 is also changed.

Thus, in the embodiment, to change the magnification while maintaining the focusing state of the pattern, the positions of the imaging lens 32 and the imaging element 33 are adjusted, respectively, so that they move along the loci shown in FIG. 20. In FIG. 20, the magnification gradually increases from the upper side to the lower side and the positions of the imaging lens 32 and the imaging element 33 are indicated for the case when the surface of the silicon wafer (object surface) is not moved. That is, when the imaging lens 32 and the imaging element 33 are located at positions where an arbitrary horizontal straight line crosses the respective locus lines, respectively, a pattern image which is formed on the imaging element 33 is brought into focus at the related magnification.

When a pattern is to be read, the silicon wafer is placed at the reference position T shown by the dot-dash-line in FIGS. 18 and 19, in particular, for a pattern of characters, symbols, and the like, the silicon wafer is positioned so that the lengthwise direction of the pattern coincides with the direction y. After the silicon wafer is positioned, the halogen lamp 11a is lit. The light beam emitted from the optical fiber 11d passes through the pinhole 12a to form an illumination light beam that is obliquely incident on the objective lens 20 and is transmitted to the silicon wafer (object surface).

The illumination light beam is reflected at the surface of the silicon wafer, passes through the objective lens 20 again, and is directed toward the imaging unit 320. The portion of the reflected light beam corresponding to the image of the light source, that is, the specularly reflected light beam, is shaded by the shading region 31b of the spatial filter 31, and other portions of the reflected light beam, that is, the diffusely reflected light beam, is incident on the imaging unit 320. An emphasized image of the pattern is formed on the imaging element 33 by the imaging lens 32 and an image signal is read by driving the imaging element 33.

If ghosting light, which is caused by surface reflection at the objective lens 20, overlaps the pattern image, the tilt of the objective lens 20 is changed by controlling the lens drive motor 226.

Further, if the surface of the silicon wafer is not flat, for example, if it has a prism shape, the pinhole unit 120 is moved closer to or away from the imaging unit 320 in the plane perpendicular to the principal beam Ax1 of the illumination light beam so that the image of the light source is formed on the shading region of the spatial filter 31.

Note, although the tilt of the silicon wafer itself may also be adjusted to adjust the position of the image of the light source, the apparatus according to the present embodiment is arranged for adjusting the pinhole unit 120. In particular, the provision of a tilting mechanism for adjusting each object to be inspected such that the reflected direction of a light beam is accurately controlled would require high sensitivity and a complicated mechanism such that the apparatus would be more expensive.

FIG. 21 shows an alternative arrangement for adjusting the position of the pinhole unit 120.

In this arrangement, a rail member 125 is provided with a guide groove 125a extending in the direction z and is secured to a movable frame (not shown). A pinhole unit 120a, to which a pinhole plate 12 and the exit end of an optical fiber 11d are secured, is mounted so as to move in the direction z along the guide groove 125a. If this arrangement is combined with the arrangement of FIGS. 18 and 19, the pinhole unit 120a may be moved in a plane which is perpendicular to the axis Ax1 of the illumination light beam according to the arrangement shown in FIG. 18 or may be moved in a plane perpendicular to the optical axis Ax of the objective lens 20 according to the arrangement shown in FIG. 21.

In a further alternative arrangement, the position of the spatial filter 31 may be made adjustable for the purpose of adjusting the relative positional relationship between the image of the light source and the shading region 31b of the spatial filter 31. FIGS. 22(A), 22(B), and 23 show a mechanism for adjusting the position of the spatial filter 31. FIG. 22(A) is a plan view of a movable frame, FIG. 22(B) is a sectional view taken along the line B—B of FIG. 22(A), and FIG. 23 is a plan view showing the movable frame assembled to fixed rails.

As shown in FIGS. 22(A), 22(B), and 23, the rectangular movable frame includes two rail members 131a, 131a, each having a C-shaped cross section with the openings thereof facing inward, disposed parallel to each other and separated by a predetermined distance. Two beam members 132a, 132b are disposed between the rail members 131a, 131a at positions near opposite ends thereof. The spatial filter 31 is inserted into the C-shaped openings of the rail members 131a, 131b and fixed by presser screws 133. Guide pins 134 are provided on the movable frame at four corners thereof and are engaged with two guide grooves 136a, 136b formed on fixed rails 135a, 135b.

According to the arrangement of FIG. 23, the spatial filter 31 is movable in the direction Y with respect to the movable frame and the movable frame is further movable in the direction Z by sliding on the fixed rails 135a, 135b. Therefore, the position of the spatial filter 31 can be adjusted in a Y-Z plane and the position of the shading region 31b of the spatial filter 31 can be adjusted so that the image of the light source is formed on the shading region 31b.

FIG. 24 shows a modification of the optical system according to the sixth embodiment. As shown in FIG. 24, the arrangement of the illumination unit 10 and the imaging lens 32 and the imaging element 33 of the detection unit 30 are the same as those shown in FIG. 14. In the modification of FIG. 24, the illumination unit 10 is disposed at a position where an illumination light beam is perpendicularly incident on the surface 1a of the silicon wafer OR. That is, a pinhole plate 12 having a pinhole 12a for forming a minute-area light source is disposed on the optical axis Ax of an objective lens 20 which is perpendicular to the surface 1a. A beam splitter 40 is disposed in the optical path between the pinhole plate 12 and the objective lens 20 to separate the optical path of the illumination light beam emitted from the illumination unit 10 from the optical path of the reflected light beam from the surface 1a.

The illumination light beam from the pinhole 12a passes through the beam splitter 40 and the objective lens 20 to become a parallel light beam (also parallel with the optical axis Ax) that illuminates the surface 1a. The reflected light beam from the surface 1a passes through the objective lens 20 again and becomes a converging light beam, a portion of which is reflected at the beam splitter 40 toward the spatial filter 31. The spatial filter 31 is at a position nearer to the objective lens 20 than a position which is conjugate with the minute-area light source and shades the specularly reflected component of the reflected light beam from the surface 1a. The diffusely reflected component passes through the spatial filter 31 and the imaging lens 32 to form an image of the pattern on the imaging element 33.

Seventh Embodiment

FIGS. 25(A), (B) show an optical system included in a pattern reading apparatus according to a seventh embodiment. The seventh embodiment is an example of a filtering optical system for detecting a pattern contained in a light-transmission-type object OT.

A light beam emitted from a light source (not shown) passes through a pinhole plate 12 to form a minute-area light source and is incident on the object OT through an illumination lens 21. The light beam then passes through an objective lens 22, a spatial filter 31, and an imaging lens 32, to form an image of the object OT on an imaging surface 33a.

The spatial filter 31 has a shading region at the center thereof for shading a portion of the light beam which forms the image of the light source and is disposed nearer to the objective lens 22 than the paraxial imaging surface IM of the light source. According to the arrangement, the image of the pattern on the object OT is formed on the image surface 33a only by the scattered component of light from the object OT.

In the optical system shown in FIG. 25(A), the pinhole plate 12 is located at the front focal point of the illumination lens 21 and the object OT is illuminated by a parallel light beam. The object OT is located at the front focal point of the objective lens 22 (the Fourier transformation lens). The back focal point of the objective lens 22 coincides with the front focal point of the imaging lens 32 and the imaging surface 33a is located at the focal point of the imaging lens 32.

FIG. 25(B) shows the case that the object OT has a prism shape, such that a light beam is deflected upward (in the view of FIG. 25(B)), that is, the object OT is formed as a wedge which is thinner at the lower edge (in the view of FIG. 25(B)). In this case, if the objective lens 22 is left in the state shown in FIG. 25(A), the image of the light source deviates upward and the portion of the light beam forming the image of the light source may not be shaded by the shading region of the spatial filter 31. To cope with this problem, as shown in FIG. 25(B), the objective lens 22 is arranged to be movable a predetermined distance in a direction opposite to the direction in which the light beam is refracted by the wedge, that is, to be moved downward in the view of FIG. 25(B). The deviation of the image of the light source caused by the prism shape of the object OT can be compensated for by movement of the objective lens 22. As a result, the portion of the light beam which forms the image of the light source can be appropriately shaded by the spatial filter 31.

Specifically, in the example in FIG. 25(B), if it is assumed that the object OT is thinner at the lower side, has an angle (the apex of the prism) of 20 minutes, and a refractive index of 1.5 and the objective lens 22 has a focal length of 200 mm, the deviation of the image of the light source caused by the effect of the wedge can be compensated by parallel movement of the objective lens 20 by about 300 $\mu$m in a direction which is opposite to the direction in which the object OT is thinner (downward), that is, in the direction in which the light beam is deflected by the wedge.

Eighth Embodiment

FIG. 26 to FIG. 28 show the arrangement of a pattern reading apparatus according to an eighth embodiment. The eighth embodiment is an example in which the principle of the parallel movement of the objective lens in the seventh embodiment is applied to an optical system for detecting a pattern contained in a light-reflection-type object.

As shown in FIG. 26, the optical system of the apparatus is composed of an illumination unit 10, an objective lens 20, and a detection unit 30. The objective lens 20 is a bi-convex lens and is disposed such that the optical axis Ax thereof is perpendicular to the surface 1a of a silicon wafer OR (reflection surface). The illumination unit 10 and the detection unit 30 are disposed approximately symmetrically on opposite sides of the optical axis Ax of the objective lens 20. As shown in FIG. 26, in this embodiment, the optical axis Ax1 of the illumination unit 10 and the optical axis Ax2 of the detection unit 30 cross the optical axis Ax of the objective lens at the surface 1a. The objective lens 20 is supported by a shift mechanism 400 so as to be movable perpendicular to the optical axis Ax of the objective lens 20 as well as in parallel with a direction X which is parallel with a plane containing the optical axes Ax1, Ax2 (which coincides with the paper surface in FIG. 26). The amount of parallel movement M of the objective lens 20 should approximately satisfy the following condition:

$$D/2 < M < D/2,$$

where D is the diameter of the objective lens 20.

The illumination unit 10 includes a lamp 11 such as a halogen lamp, or the like, and a pinhole plate 12 in which a pinhole 12a is formed to permit a portion of the light beam emitted from the light source to pass therethrough to form a minute-area light source. A diffusion plate 13 is interposed between the lamp 11 and the pinhole plate 12 to eliminate any effect due to an image of a filament of the lamp 11.

The detection unit 30 includes a spatial filter 31, an imaging lens 32, and an imaging element 33, such as a CCD image sensor, or the like. In the embodiment shown in FIG. 26, the detection unit 30 is disposed on a line extending in a direction in which light from the light source will be specularly reflected from the surface 1a.

A light beam emitted from the lamp 11 becomes a parallel light beam after passing through the objective lens 20 and obliquely illuminates the surface 1a of the silicon wafer OR. In particular, the pinhole 12a is disposed at the front focal position of the objective lens 20 (i.e., a position on a plane which is perpendicular to the optical axis Ax of the objective lens 20, and which includes a front focal point of the objective lens 20). The parallel light beam is diffusely reflected at edges of the pattern and specularly reflected at portions other than the edges.

The reflected light beam from the surface 1a passes through the objective lens 20 again, and becomes a converging light beam directed toward the detection unit 30. The spatial filter 31 is disposed between the imaging lens 32 and the objective lens 20 at a position nearer to the objective lens 20 than the image of the light source formed by the objective lens 20. Thus, only the diffusely reflected component that passes through the spatial filter 31, is incident on the imaging lens 32, and the image of the pattern impressed on the surface 1a is formed on the imaging element 33 by the diffusely reflected component. The imaging element 33 converts the image of the pattern into an electric signal and outputs the signal to an image processing apparatus (not shown).

The parallel movement of the objective lens 20 is effective to prevent the effect of the ghosting light in the reflection-type system, similar to the eighth embodiment, in addition to compensate for the effect due to the wedge-shaped object as described for the fifth embodiment.

In particular, when ghosting light, which is made by reflection at the surface of the objective lens 20, is incident on the imaging lens 32 and overlaps the position of the image pattern on the imaging element 33, it is difficult to read the image pattern because the contrast thereof is lowered. In such a case, by adjusting the objective lens 20, by the parallel movement thereof, so that the ghosting light does not overlap the image pattern, the contrast is not lowered and the pattern can be correctly read. Further, if the surface 1a is tilted, for example if the silicon wafer OR has a wedge shape, the position where the image of the light source is formed can be adjusted to coincide with the shading region of the spatial filter 31 by parallel movement of the objective lens 20.

When the objective lens is moved to lower the effect of the ghosting light, at least the surface of the objective lens 20, where the ghosting light is made, must be a curved surface. When both the surfaces of the objective lens 20 are curved as in the case of FIG. 26, both ghosting light caused by the surface reflection arising at the lens surface on the side of the light source and ghosting light due to the inner surface reflection caused at the lens surface on the side of the silicon wafer OR can be eliminated by the parallel movement of the objective lens 20.

FIG. 27 is a plan view showing the arrangement of the shift mechanism 400 for parallel movement of the objective lens 20 and FIG. 28 is a side view thereof. The objective lens 20 is supported by a flat-plate-shaped lens holder 410. The lens holder 410 is guided by a pair of guide rails 420, 421 and is movable in a direction X. The guide rails 420, 421 are coupled with each other by bridge members 430, 431 at ends thereof. Thus, a rectangular frame is formed by the guide rails 420, 421 and the bridge members 430, 431.

A pair of tension springs 440, 441 are interposed between the lens holder 410 and the bridge member 430 such that the lens holder 410 is drawn towards the bridge member 430. Further, a micrometer head 450 is fixed to the center of the bridge member 430 and an end of the micrometer head 450 abuts the lens holder 410 such that the position of the lens holder 410, that is, the position of the objective lens 20 may be adjusted by rotating the micrometer head.

In particular, the micrometer head 450 may be rotated such that the lens holder 410 moves downward in the view of FIG. 27 against the urging force of the springs 440, 441, or such that the lens holder 410 moves upward in the view of FIG. 27 by being pulled by the springs 440, 441. Thus, the objective lens 20 can be set to an optimum position, that is, a position where the image of the light source coincides with the shading portion of the spatial filter 31 and ghosting light is not incident on the imaging element 33 by adjusting the micrometer head 450 while observing an image formed on the imaging element 33.

If the silicon wafer OR also has a tilt or wedge shape in a direction perpendicular to the paper surface of FIG. 26 (direction Y), it is preferable to also adjust the objective lens 20 in the direction Y. FIG. 29 is a plan view showing an alternative shift mechanism by which the objective lens 20 may also be adjusted in the direction Y, perpendicular to the optical axis Ax of the objective lens 20 as well as perpendicular to the direction X. The shift mechanism includes a Y-direction shift mechanism 500 and the X-direction shift mechanism 400 shown in FIG. 27.

The Y-direction shift mechanism 500 includes a pair of guide rails 520, 521 for guiding the X-direction shift mechanism 400 for parallel movement and bridge members 530, 531 for coupling the guide rails 520, 521 at the ends thereof to form a rectangular frame. A pair of tension springs 540, 541 are interposed between the bridge member 530 and the guide rail 421 of the x-direction shift mechanism 400 such that the X-direction shift mechanism 400 is drawn towards the bridge member 530. Further, the bridge member 530 is provided with a micrometer head 550, an end of which is abutted against the guide rail 421.

Similar to the above, the micrometer head 550 may be adjusted such that the x-direction shift mechanism 400 is moved against the urging force of the springs 540, 541 or such that the x-direction shift mechanism 400 is moved by being pulled by the springs 540, 541. Thus, according to the arrangement of FIG. 29, if the silicon wafer OR has a tilt or wedge component in any direction, the objective lens 20 can be set to a position where the image of the light source coincides with the shading portion of the spatial filter 31 and ghosting light is not incident on the imaging element 33 by adjusting the objective lens 20 in the X - Y direction.

Note that the amount of shift of the objective lens with respect to the angle of the silicon wafer OR is different depending upon a direction in which the angle is formed. For example, if the silicon wafer OR is tilted 1 degree in the direction X, a light beam is angularly changed only in the direction X and the amount of change is about 2 degrees, whereas if the silicon wafer OR is tilted 1 degree in the direction Y, the light beam is angularly changed 1.4 degrees in the direction Y and angularly changed by a small amount in the direction X. Therefore, when the silicon wafer OR is tilted in the direction X, it suffices to shift the objective lens 20 in only the direction X, however, when the silicon wafer OR is tilted in the direction Y, the objective lens 20 should be adjusted in both the directions X and Y.

Ninth Embodiment

FIG. 30(A) shows an optical system included in a pattern reading apparatus according to a ninth embodiment. The ninth embodiment is an example of a filtering optical system for detecting a pattern contained in a light-transmission-type object.

A light beam emitted from a light source (not shown) passes through a pinhole plate 12 to form a minute-area light source and is directly incident on the object OT without passing through a lens. The light beam passes through the object OT, through an objective lens 22, and through a spatial filter 31, to form an image of the object OT on an imaging surface 33a. The spatial filter 31 has a shading region at the center thereof for shading the portion of the light beam which forms the image of the light source, i.e., a portion of the light beam that is not scattered by the object OT. The spatial filter 31 is disposed nearer to the objective lens 22 than the paraxial image point IM of the light source.

In the optical systems for reading the pattern of the light-transmission-type object in the above embodiments, an illuminating lens is interposed between the pinhole plate 12 and the object OT, an objective lens is interposed between the object TO and the spatial filter, and an imaging lens is interposed between the spatial filter and the imaging element. Thus, there are three lenses. On the other hand, in the optical system shown in FIG. 30(A), since the light beam is directly incident on the object OT, only two lenses are required, such that the cost of the optical system can be reduced.

The optical system in FIG. 30(B) shows a modification of the ninth embodiment in which the imaging lens 32 of FIG. 30(A) is not required. In this case, the objective lens 22 is provided with an imaging power for forming the image of a pattern on the imaging element 33. According to the arrangement shown in FIG. 30(B), only one lens is included in the optical system, such that the cost of the optical system can be further reduced from that of the arrangement in FIG. 30(A).

Tenth Embodiment

FIG. 31 shows an arrangement of a pattern reading apparatus according to a tenth embodiment. The tenth embodiment is an example in which the principle of reducing the number of lenses of the ninth embodiment is applied to an optical system for detecting a pattern contained in a light-reflection-type object.

In an apparatus for reading a pattern on a light-reflection-type object, a single objective lens can act as both an illumination lens between a light source and an object and an objective lens between the object and a spatial filter, however, there are some problems. For example, when an incident light beam is obliquely incident on an object surface, an objective lens with a large diameter is required. Further, when the light beam is perpendicularly incident on the object surface, a beam splitter is necessary to separate a reflected light beam and the quantity of light which reaches an imaging element is lowered to about half that when the light beam is obliquely incident.

As shown in FIG. 31, the optical system of the apparatus includes an illumination unit 10, an objective lens 23 and a detection unit 30. The illumination unit 10 and the detection unit 30 are positioned symmetrically with respect to the normal of a surface 1a so that when a light beam passing through the center of a pinhole which coincides with the optical axis Ax1 of the illumination unit 10 is specularly reflected, the light beam coincides with the optical axis Ax2 of the detection unit 30.

The illumination unit 10 includes a lamp 11, a pinhole plate 12 with a pinhole 12a (a minute-area light source), and a diffusion plate 13. The detection unit 30 includes a spatial filter 31, an imaging lens 32, and an imaging element 33.

The light beam emitted from the light source is obliquely incident on the surface 1a as a divergent light beam and illuminates the surface 1a of a silicon wafer OR. The light beam is diffusely reflected by an impressed pattern on the surface 1a and specularly reflected at other portions. The reflected light beam passes through the objective lens 23 as a converging light beam directed toward the detection unit 30. The converging light beam passes through the spatial filter 31 and an imaging lens 32 and an image of the pattern on the surface 1a is formed on the imaging element 33 by the diffusely reflected component. That is, the spatial filter 31 shades the specularly reflected component.

FIG. 32 shows a modification of the tenth embodiment in which the principle of the arrangement of FIG. 30(B) is applied to an optical system for reading a light-reflection-type object. In particular, the optical system shown in FIG. 32 does not include the imaging lens 32 which is included in the optical system in FIG. 31. In this case, an objective lens 23 is designed to form the image of the pattern on an imaging element 33. Otherwise, the arrangement of the elements in this modification is the same as the arrangement of the optical system in FIG. 31.

For this modification, an illumination light beam reaches the surface 1a of the silicon wafer OR as a divergent light beam, is reflected at the surface 1a, and is incident on the objective lens 23. The objective lens 23 converges the reflected light beam and images the pattern on the surface 1a of the imaging element 33. The spatial filter 31 is disposed nearer to the objective lens 23 than an image of the light source formed by the objective lens 23 and shades the specularly reflected component of the reflected light beam. Therefore, the image of the pattern is formed on the imaging element 33 by the scatteringly reflected component of the reflected light beam.

Eleventh Embodiment

FIG. 33 shows an optical system of a pattern reading apparatus according to an eleventh embodiment. The optical system includes an illumination unit 10, an objective lens 23, and a detection unit 30. The illumination unit 10 and the detection unit 30 are disposed symmetrically with respect to a normal of a surface 1a so that when a light beam passing through the center of a pinhole which coincides with the optical axis Ax1 of the illumination unit 10 is specularly reflected, the light beam coincides with the optical axis Ax2 of the detection unit 30.

The illumination unit 10 includes a lamp 11, a pinhole plate 12 with a pinhole 12a to form a minute-area light source, and a diffusion plate 13. The illumination unit 10 is disposed such that an illumination light beam is obliquely incident on an object surface at a predetermined incident angle. The detection unit 30 includes a spatial filter 31, an imaging lens 32, and an imaging element 33. The spatial filter 31 includes a shading region at the center thereof and is disposed nearer to the objective lens than a paraxial imaging point of the minute-area light source.

An illumination light beam emitted from the illumination unit 10 is incident on the surface 1a obliquely as a divergent light beam. At the surface 1a, the illumination light beam is diffusely reflected at an impressed pattern on the surface 1a and specularly reflected at portions other than the pattern. The reflected light beam passes through the objective lens 23 and exits as a converging light beam directed toward the detection unit 30. At the spatial filter 31, the scattered reflected component passes through but the specularly reflected component does not. The scatterered reflected component passes through the imaging lens 32 to form an image of the pattern on the surface 1a on the imaging element 33.

In this embodiment, the principal plane 32a of the imaging lens 32, the surface 1a, and the imaging surface 33a of the imaging element 33 are disposed such that imaginary lines extending therefrom cross each other at an axis RL, as shown by the dashed lines in FIG. 33, based on Scheimpflug's rule. Such a disposition eliminates the effect of tilt of the image plane, which is conjugate to the surface 1a, with respect to the image surface 33a. As a result, even if a pattern has a width in a direction parallel to a plane including both optical axes Ax1, Ax2, the pattern can be brought into focus as a whole.

The imaging element 33 converts the image of the pattern into an electric signal and inputs the signal to an image processing apparatus (not shown). The image processing apparatus displays the image of the pattern on a display screen or analyzes the content of the pattern using a character recognition algorithm or the like.

Note that, when the surface 1a is not parallel with the image surface 33a, as in this embodiment, since a magnification changes depending upon position in a direction parallel to the plane including both the optical axes, a formed pattern is distorted. If the distortion of the image of the pattern affects reading, the distortion can be compensated for by image processing such as an affine transformation or the like.

FIG. 34 shows a modification of the optical system of the eleventh embodiment. The optical system in FIG. 34 does not include the imaging lens 32 of FIG. 33 and an objective lens 23 is designed to form an image of a pattern directly on an imaging element 33. In particular, in this case, the principal plane 23a of the objective lens 23, a surface 1a, and the image surface 33a of the imaging element 33 are disposed such that imaginary lines extending therefrom cross each other on an axis RL, as shown by the dashed lines in FIG. 34, based on Scheimpflug's rule. Otherwise, the arrangement is the same as that of the optical system of FIG. 33.

In this case, the illumination light beam emitted from the illumination unit 10 is incident on the surface 1a of the silicon wafer OR as a divergent light beam and is reflected at the surface 1a. The objective lens 23 converges the reflected light beam and images the pattern on the surface 33a of the imaging element 33. The spatial filter 31 is disposed nearer to the objective lens 23 than the paraxial imaging point of the minute-area light source and shades the specularly reflected component. Thus, the diffusely reflected light beam passes through the spatial filter 31 and forms the image of the pattern on the imaging element 33.

According to the eleventh embodiment, an object surface can be made conjugate with an imaging surface by disposing the lens having the imaging function and the imaging surface according to Scheimpflug's rule, such that an in-focus pattern image can be obtained.

Twelfth Embodiment

FIG. 35 shows an optical system for a pattern reading apparatus according to a twelfth embodiment. The optical system includes a light emitting diode 10a, an objective lens 20, an imaging lens 32, and an imaging element 33. The light emitting diode 10a (light source) is disposed at a position which is conjugate with a center of curvature of a surface 1a of a silicon wafer OR through the objective lens 20. The imaging lens 32 is disposed at a position which is farther from the silicon wafer OR than the light emitting diode 10a. Further, optical axes Ax of the objective lens 20 and the imaging lens 32 are coincident and perpendicular to the surface 1a. Because the surface 1a is flat, in the example shown in FIG. 35, the light emitting diode 10a is positioned approximately at a focal point of the objective lens 20.

In the twelfth embodiment, the light beam emitted from the light emitting diode 10a passes through the objective lens 20 and illuminates the surface 1a of the silicon wafer OR as a parallel light beam perpendicular to the surface 1a. The illumination light beam is diffusely reflected at an impressed pattern on the surface 1a and specularly reflected at other portions. The specularly reflected component is converged to the position of the light emitting diode 10a as the reflected light beam passes through the objective lens 20 and is shaded by the light emitting diode 10a.

The diffusely reflected component is not shaded by the light emitting diode 10a and passes through the imaging lens 32 to form an image of the pattern on the imaging element 33.

FIG. 36 shows a modification of the optical system according to the twelfth embodiment. As shown in FIG. 36 a light source includes a light emitting element, such as a semiconductor laser 11a, a light guide fiber 14, and a coupling lens 15. The semiconductor laser 11a and the coupling lens 15 are disposed outside of the optical path between the surface 1a and the imaging element 33. The light guide fiber 14 extends from an entrance end 14a near the coupling lens 15 to an exit end 14b disposed at a position which is conjugate with the center of curvature of the surface 1a through the objective lens 20. Since, in FIG. 36, the surface 1a is flat, the exit end 14b of the light guide fiber 14 is disposed approximately at the focal point of the objective lens 20. Otherwise, the arrangement of the optical system is the same as that of FIG. 35.

With this modification, the laser beam emitted from the semiconductor laser 11a is incident on the entrance end 14a of the light guide fiber 14 through the coupling lens 15. Then, the laser beam emitted from the exit end 14b of the light guide fiber 14 illuminates the surface 1a through the objective lens 20 as a parallel light beam. Since the reflected light beam from the surface 1a is converged when it passes through the objective lens 20 again, a specularly reflected component is shaded by the end of the fiber and only a diffusely reflected component passes through the imaging lens 32 to form an image of a pattern on the surface 1a on the imaging element 33.

According to the twelfth embodiment, the size of the optical system can be reduced as compared with an optical system in which the light beam is obliquely incident. Further, the quantity of light is larger than when a beam splitter is used. Still further, the light source acts as a spatial filter for shading the specularly reflected component of light from the object surface so that a distinct image of the pattern can be formed by a diffusely reflected component without the provision of an additional filter.

The present disclosure relates to subject matter contained in Japanese Patent Applications No. HEI 08-241112, filed on Aug. 23, 1996, No. HEI 08-301076, filed on Oct. 25, 1996, No. HEI 08-342775, filed on Dec. 6, 1996, No. HEI 08-342776, filed on Dec. 6, 1996, No. HEI 08-342777, filed on Dec. 6, 1996, No. HEI 08-342778, filed on Dec. 6, 1996, No. HEI 09-65333, filed on Mar. 4, 1997, No. HEI 09-74497, filed on Mar. 11, 1997, No. HEI 09-65334, filed on Mar. 4, 1997, No. HEI 09-134312, filed on May 8, 1997, and No. HEI 09-165422, filed on Jun. 6, 1997, which are expressly incorporated herein by reference in their entirety.

What is claimed is:

1. A pattern reading apparatus for causing an illumination light beam, emitted from a minute-area light source, to be incident on an object surface having a pattern formed thereon as an object to be read, converging a light beam having information of the pattern by an objective lens, causing the light beam having to be incident on an imaging lens, forming an image of the pattern by the imaging lens and reading the image, the pattern reading apparatus comprising an adjustment mechanism that adjusts a position of said light source in a plane which intersects a principal beam of the illumination light beam and a spatial filter positioned in the path of light having information of the pattern, said spatial filter configured such that a central portion of said spatial filter shields light of the illumination light beam and a peripheral portion of said spatial filter transmits light of the illumination light beam.

2. The pattern reading apparatus according to claim 1, said light source further comprising a pinhole that causes a portion of the light beam from the light source to pass therethrough, wherein said adjustment mechanism moves said light source and said pinhole together.

3. The pattern reading apparatus according to claim 2, wherein the light source includes a lamp and an optical fiber for introducing the light beam from the lamp into the pinhole, and said adjustment mechanism moves an exit end of the optical fiber and the pinhole together.

4. The pattern reading apparatus according to claim 1, wherein said adjustment mechanism moves said light source in a plane approximately perpendicular to the principal beam of the illumination light beam.

5. The pattern reading apparatus according to claim 1, wherein the object surface is a reflection surface and is positioned such that the light beam, which is emitted from the light source and reaches the object surface through the objective lens, is reflected at the object surface to be incident on the imaging lens after the reflected beam passes through the objective lens again.

6. The pattern reading apparatus according to claim 5, wherein the light source and the imaging lens are positioned on opposite sides of the optical axis of the objective lens, and the light source is positioned such that the illumination light beam is perpendicularly incident on the object surface.

7. The pattern reading apparatus according to claim 1, wherein said adjustment mechanism moves the light source in a plane which is approximately perpendicular to an optical axis of the objective lens.

8. The pattern reading apparatus according to claim 1, further comprising an imaging element positioned at the imaging position of the pattern image for reading the pattern.

9. The pattern reading apparatus according to claim 1, said spatial filter being positioned between said objective lens and said imaging lens.

10. A pattern reading apparatus for causing an illumination light beam emitted from a minute-area light source to be incident on an object surface having a pattern formed thereon as an object to be read, converging a light beam having the information of the pattern by an objective lens, causing the light beam having passed through the objective lens to be incident on an imaging lens through a spatial filter, forming the image of the pattern by the imaging lens and reading the image, wherein the spatial filter is a filter having a shading region for shading paraxial rays and the apparatus comprises an adjustment mechanism that adjusts the relative positional relationship between the position of the image of the light source formed by the objective lens and the shading region of the spatial filter in a plane which crosses an optical axis of the imaging lens.

11. A pattern reading apparatus according to claim 10, wherein said adjustment mechanism moves the light source.

12. The pattern reading apparatus according to claim 11, wherein said light source includes a pinhole that causes a portion of the light beam from the light source to pass therethrough, and said adjustment mechanism moves the light source and the pinhole together.

13. The pattern reading apparatus according to claim 10, wherein said adjustment mechanism moves the shading portion of the spatial filter.

14. The pattern reading apparatus according to claim 10, wherein the object surface is a reflection surface and is positioned such that the light beam, which is emitted from the light source and reaches the object surface through the objective lens, is reflected at the object surface and is incident on the imaging lens after the light beam passes through the objective lens again.

15. The pattern reading apparatus according to claim 14, wherein the light source and the imaging lens are positioned on different sides of an optical axis of the objective lens, and the light source is positioned such that the illumination light beam is obliquely incident on the object surface.

16. The pattern reading apparatus according to claim 10, wherein said spatial filter is positioned nearer to the objective lens than a paraxial image point of the light source formed through the objective lens.

* * * * *